(12) United States Patent
Meyers et al.

(10) Patent No.: US 11,392,029 B2
(45) Date of Patent: *Jul. 19, 2022

(54) ORGANOMETALLIC SOLUTION BASED HIGH RESOLUTION PATTERNING COMPOSITIONS AND CORRESPONDING METHODS

(71) Applicant: Inpria Corporation, Corvallis, OR (US)

(72) Inventors: Stephen T. Meyers, Corvallis, OR (US); Jeremy T. Anderson, Corvallis, OR (US); Joseph B. Edson, Corvallis, OR (US); Kai Jiang, Corvallis, OR (US); Douglas A. Keszler, Corvallis, OR (US); Michael K. Kocsis, Leuven (BE); Alan J. Telecky, Albany, OR (US); Brian J. Cardineau, Corvallis, OR (US)

(73) Assignee: Inpria Corporation, Corvallis, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/674,714

(22) Filed: Nov. 5, 2019

(65) Prior Publication Data

US 2020/0064733 A1 Feb. 27, 2020

Related U.S. Application Data

(63) Continuation of application No. 14/920,107, filed on Oct. 22, 2015, now Pat. No. 10,642,153.

(60) Provisional application No. 62/067,552, filed on Oct. 23, 2014, provisional application No. 62/119,972, filed on Feb. 24, 2015.

(51) Int. Cl.
```
G03F 7/004      (2006.01)
G03F 7/32       (2006.01)
G03F 7/20       (2006.01)
```
(52) U.S. Cl.
CPC .......... *G03F 7/0042* (2013.01); *G03F 7/0043* (2013.01); *G03F 7/2004* (2013.01); *G03F 7/32* (2013.01); *G03F 7/322* (2013.01); *G03F 7/325* (2013.01)

(58) Field of Classification Search
CPC .... G03F 7/0042; G03F 7/0043; G03F 7/0048; G03F 7/004
See application file for complete search history.

(56) References Cited

U.S. PATENT DOCUMENTS

| | | |
|---|---|---|
| 3,385,915 A | 5/1968 | Hamling |
| 3,635,883 A | 1/1972 | Stamm |
| 4,014,858 A | 3/1977 | Chipman et al. |
| 4,102,683 A | 7/1978 | DiPiazza |
| 4,104,292 A | 8/1978 | Dworkin et al. |
| 4,144,222 A | 3/1979 | Shinmi et al. |
| 4,174,346 A | 11/1979 | Collins et al. |
| 4,370,405 A | 1/1983 | O'Toole et al. |
| 4,380,559 A | 4/1983 | Mandai et al. |
| 4,601,917 A | 7/1986 | Russo et al. |
| 4,639,208 A | 1/1987 | Inui et al. |
| 4,732,841 A | 3/1988 | Radigan |
| 4,851,481 A | 1/1989 | Kuriyama et al. |
| 4,891,303 A | 1/1990 | Garza et al. |
| 4,910,122 A | 3/1990 | Arnold et al. |
| 5,025,094 A | 6/1991 | King |
| 5,672,243 A | 9/1997 | Hsia et al. |
| 5,891,985 A | 4/1999 | Brugel |
| 6,020,269 A | 2/2000 | Wang et al. |
| 6,060,380 A | 5/2000 | Subramanian et al. |
| 6,183,716 B1 | 2/2001 | Sleight et al. |
| 6,194,323 B1 | 2/2001 | Downey et al. |
| 6,197,896 B1 | 3/2001 | Aviram et al. |
| 6,268,457 B1 | 7/2001 | Kennedy et al. |
| 6,271,329 B1 | 8/2001 | Kristen et al. |
| 6,287,951 B1 | 9/2001 | Lucas et al. |
| 6,420,088 B1 | 7/2002 | Angelopoulos et al. |
| 6,566,276 B2 | 5/2003 | Maloney et al. |
| 6,583,071 B1 | 6/2003 | Weidman et al. |

(Continued)

FOREIGN PATENT DOCUMENTS

| | | |
|---|---|---|
| CN | 1457504 A | 11/2003 |
| EP | 1067595 A2 | 1/2001 |

(Continued)

OTHER PUBLICATIONS

Ahmed et al., "Synthesis and Characterization of Zirconium and Hafnium Sulfates, Hydroxide Sulfates and Oxide Sulfates", Acta Chemica Scandinavica, 53:24-33 (1999).
Chandrasekhar et al., "Organotin assemblies containing Sn—O bonds" Coordination Chemistry Reviews 235:1-52, (2002).
Eychenne-Baron et al., "New synthesis of the nanobuilding block {(BuSn)12O14(OH6}2+ and exchange properties of {(BuSn)12O14(OH6}(O3SC6H4CH3)2," Journal of Organometallic Chemistry, 567:137-142 (1998).
Eychenne-Baron et al., "Reaction of butyltin hydroxide oxide with p-toluenesulfonic acid: Synthesis, X-ray crystal analysis, and multinuclear NMR characterization of {(BuSn)12O14(OH)6}(4-CH3C6H4SO3)2," Organometallics, 19:1940-1949 (2000).
Hänssgen et al., "Synthese der ersten mono-t-butylzinnelementverbinfdungen," Journal of Organometallic Chemistry, 293:191-195 (1985). (English Abstract Only).

(Continued)

*Primary Examiner* — Daborah Chacko-Davis
(74) *Attorney, Agent, or Firm* — Christensen, Fonder, Dardi & Herbert PLLC; Diane E. Bennett; Peter S. Dardi

(57) ABSTRACT

Organometallic radiation resist compositions are described based on tin ions with alkyl ligands. Some of the compositions have branched alkyl ligands to provide for improved patterning contrast while maintaining a high degree of solution stability. Blends of compounds with distinct alkyl ligands can provide further improvement in the patterning. High resolution patterning with a half-pitch of no more than 25 nm can be achieved with a line width roughness of no more than about 4.5 nm. Synthesis techniques have been developed that allow for the formation of alkyl tin oxide hydroxide compositions with very low metal contamination.

20 Claims, 18 Drawing Sheets

(56) References Cited

U.S. PATENT DOCUMENTS

| | | | |
|---|---|---|---|
| 6,730,454 | B2 | 5/2004 | Pfeiffer et al. |
| 6,825,131 | B2 | 11/2004 | Nishida et al. |
| 6,844,604 | B2 | 1/2005 | Lee et al. |
| 6,927,108 | B2 | 8/2005 | Weng et al. |
| 6,946,677 | B2 | 9/2005 | Ostergard |
| 7,001,821 | B2 | 2/2006 | Aggarwal et al. |
| 7,208,341 | B2 | 4/2007 | Lee et al. |
| 7,256,129 | B2 | 8/2007 | Nam et al. |
| 7,773,365 | B2 | 8/2010 | Herman et al. |
| 7,799,503 | B2 | 9/2010 | Brodsky et al. |
| 8,053,370 | B2 | 11/2011 | Yang et al. |
| 8,092,703 | B2 | 1/2012 | Ishibashi et al. |
| 8,366,967 | B2 | 2/2013 | Keszler et al. |
| 8,415,000 | B2 | 4/2013 | Stowers et al. |
| 8,454,928 | B2 | 6/2013 | Dussarrat |
| 9,310,684 | B2 | 4/2016 | Meyers et al. |
| 10,025,179 | B2 | 7/2018 | Meyers et al. |
| 10,642,153 | B2 * | 5/2020 | Meyers ............... G03F 7/2004 |
| 2001/0001796 | A1 | 5/2001 | Lynch et al. |
| 2002/0076495 | A1 | 6/2002 | Maloney et al. |
| 2003/0124457 | A1 | 7/2003 | Jung et al. |
| 2004/0067444 | A1 | 4/2004 | Wakabayahsi et al. |
| 2005/0266700 | A1 | 12/2005 | Jurisich et al. |
| 2006/0088962 | A1 | 4/2006 | Herman et al. |
| 2006/0234138 | A1 | 10/2006 | Fehlhaber et al. |
| 2008/0055597 | A1 | 3/2008 | Sun et al. |
| 2009/0155546 | A1 | 6/2009 | Yamashita et al. |
| 2009/0174036 | A1 | 7/2009 | Fuller et al. |
| 2010/0044698 | A1 | 2/2010 | Herman et al. |
| 2010/0099908 | A1 | 4/2010 | Yoshitomo et al. |
| 2010/0184259 | A1 | 7/2010 | Radigan et al. |
| 2011/0045406 | A1 | 2/2011 | Keszler et al. |
| 2011/0135823 | A1 | 6/2011 | Lee et al. |
| 2011/0166268 | A1 | 7/2011 | Deelman et al. |
| 2011/0206599 | A1 | 8/2011 | Keszler et al. |
| 2011/0244403 | A1 | 10/2011 | Carcasi et al. |
| 2011/0251354 | A1 | 10/2011 | Marechal |
| 2011/0293888 | A1 | 12/2011 | Stowers et al. |
| 2012/0223418 | A1 | 9/2012 | Stowers et al. |
| 2013/0224652 | A1 | 8/2013 | Bass et al. |
| 2013/0253161 | A1 | 9/2013 | Amako et al. |
| 2014/0303283 | A1 | 10/2014 | Ding et al. |
| 2015/0056542 | A1 | 2/2015 | Meyers et al. |
| 2015/0079393 | A1 | 3/2015 | Freedman et al. |
| 2015/0221519 | A1 | 8/2015 | Marks et al. |
| 2015/0253667 | A1 | 9/2015 | Bristol et al. |
| 2016/0116839 | A1 | 4/2016 | Meyers et al. |
| 2017/0100742 | A1 | 4/2017 | Pore et al. |
| 2017/0184960 | A1 | 6/2017 | Naruoka et al. |
| 2017/0184961 | A1 | 6/2017 | Nakagawa et al. |
| 2020/0064733 | A1 | 2/2020 | Meyers et al. |

FOREIGN PATENT DOCUMENTS

| | | |
|---|---|---|
| EP | 1992665 A1 | 11/2008 |
| GB | 2466486 | 6/2010 |
| JP | 57-123126 | 7/1982 |
| JP | S63-241061 A | 10/1988 |
| JP | 2001-81560 A | 3/2001 |
| JP | 2008-091215 A | 4/2008 |
| JP | 2010-094583 A | 4/2010 |
| JP | 2016-530565 A | 9/2016 |
| JP | 2018-502173 A | 1/2018 |
| JP | 2018-017780 A | 2/2018 |
| WO | 1998-015559 A1 | 4/1998 |
| WO | 2009-138474 A1 | 11/2009 |
| WO | 2010-000504 A1 | 1/2010 |
| WO | 2014-150411 A1 | 9/2014 |
| WO | 2016-065120 A1 | 4/2016 |
| WO | 2016-043198 A1 | 7/2017 |
| WO | 2016-043200 A1 | 7/2017 |
| WO | 2018-123388 A1 | 7/2018 |
| WO | 2018-123537 A1 | 7/2018 |
| WO | 2018-139109 A1 | 8/2018 |
| WO | 2018-168221 A1 | 9/2018 |

OTHER PUBLICATIONS

Jaumier et al., "Transmetalation of Tetraalkynyltin Compounds with Grignard Reagents and Transformation into Organotin Oxides, Alkoxides and Oxocaroxylates," Angewandte Chemie International Edition, 38(3):402-404 (Feb. 1, 1999).

Jaumier et al., "New route to monoorganotin oxides and alkoxides from trialkynylorganotins," Chemical Communications, (3):369-370 (1998).

Jones et al., "Amino-Derivatives of Metals and Metalloids. Part I. Preparation of Aminostannenes, Stannylamines and Stannazanes" Journal of the Chemical Society, 1944-1951 (1965).

Levashov et al., "Lewis Acid Promoted Direct Synthesis of Tetraalkynylstannanes," Tetrahedron Letters, (2015), 56(14):1870-1872.

Meyers et al., "Solution-Processed Aluminum Oxide Phosphate Thin-Film Dielectrics," Chem. Mater., 19(16):4023-4029 (2007). (Abstract Only).

Nakata et al., "Improvement of InGaZnO4 Thin Film Transistors Characteristics Utilizing Excimer Laser Annealing," The Japan Society of Applied Physics (2009). (Abstract Only).

Neef et al., "Effects of Carbon/Hardmask Interactions on Hardmask Performance," Proc. of SPIE, 7273, 727311-1-727311-7 (2009).

Owen et al., "⅛ μm Optical Lithography," J. Vac. Sci. Technology, B(10), 3032 (1992). (Abstract Only).

Puff et al., "Zur Hydrolyse Von Monoorganylzinn-Trihalogeniden," Journal of Organometallic Chemistry, 368:173-183 (1989). (English Abstract Only).

Stowers, "Direct Patterning of Solution Deposited Metal Oxides," A Dissertation to Oregon State University, 1-149. Aug. 14, 2008.

Stowers et al., "High Resolution, High Sensitivity Inorganic Resists," Microelectronic Engineering, 86:730-733 (2009).

Stowers et al., "Directly Patterned Inorganic Hardmask For EUV Lithography," Proc. SPIE 7969, 796915; http://dx.doi.org/10.1117/12.879542 (2011).

Wang et al.,"TiO2 Micro-Devices Fabricated by Laser Direct Writing," Optics Express, 19(18):17390-173935 (Aug. 29, 2011).

Zhang et al., "Stabilization of Cubic ZrO2 With Rh(III) and/or La(III)," Journal of Solid State Chemistry, 72:131-136 (1988).

Zimmerman, "Extension Options for 193nm Immersion Lithography," Journal of Photopolymer Science and Technology, 22(5):625-634 (2009); (Abstract Only).

International Search Report and Written Opinion From Related Application No. PCT/US15/56865 dated Feb. 5, 2016 (12 pages).

"Space Environment (Natural and Aililicial)—Process for Determining Solar Irradiances", First Edition, Reference No. ISO 21348:2007€, International Standard ISO 21348, 20 pages (2007).

European Communication and Search Report from copending European Application No. 15852808.3 dated Jun. 12, 2018 (9 pages).

Office Action from Co-pending Japanese Application No. 2017-522030 dated Aug. 20, 2019.

Office Action from Co-pending Taiwan Application No. 104134973 dated Sep. 23, 2019.

Communication and Search Report from copending European Application No. 15852808.3 dated May 11, 2020.

Office Action from co-pending Korean Application No. 10-2017-7013873 dated May 21, 2020.

Office Action from Co-pending Japanese Application No. 2017-522030 dated Jun. 2, 2020.

* cited by examiner

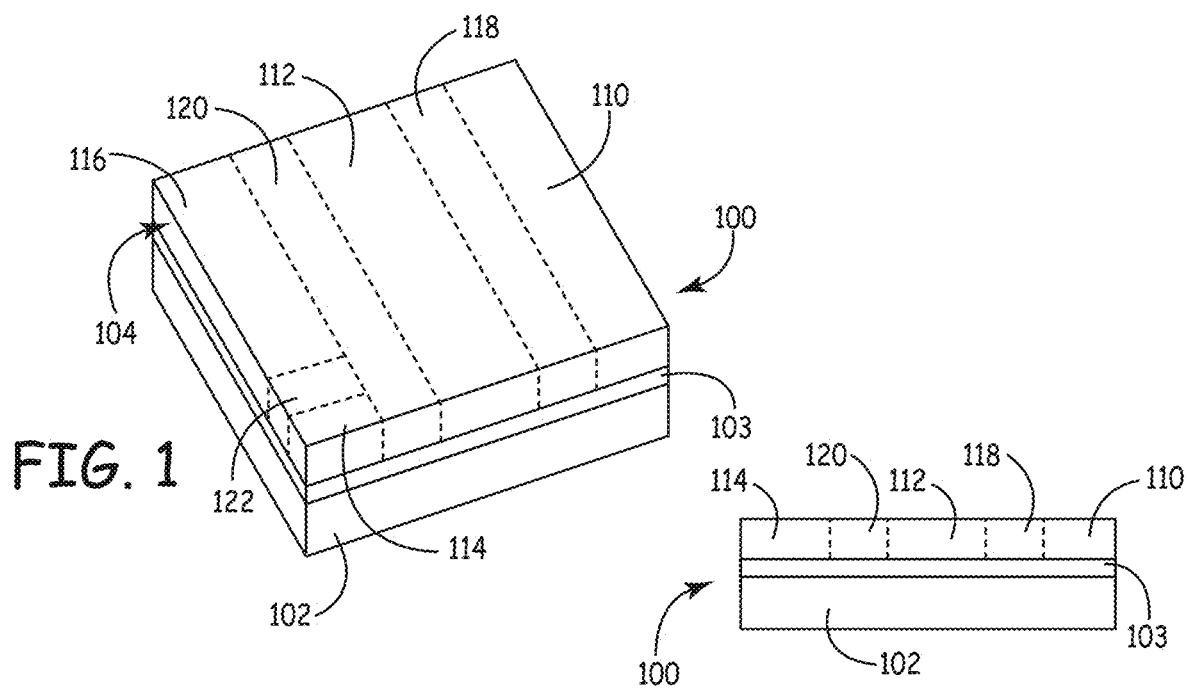
FIG. 1
FIG. 2
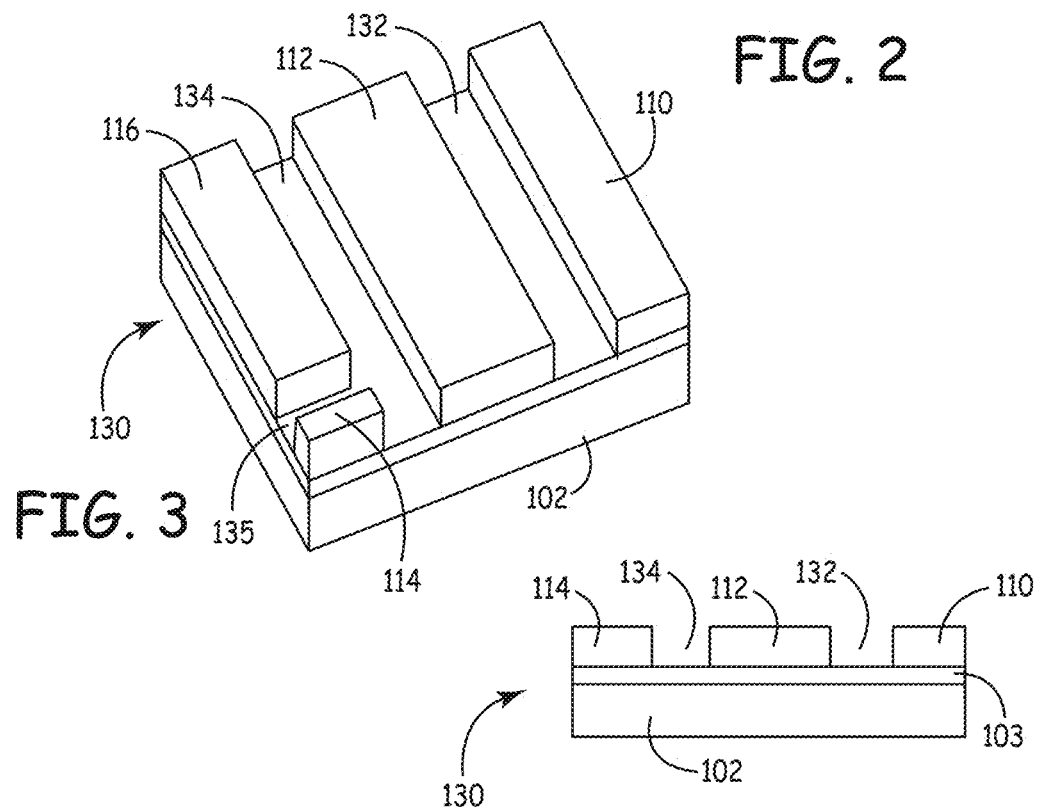
FIG. 3
FIG. 4

ORGANOMETALLIC SOLUTION BASED HIGH RESOLUTION PATTERNING COMPOSITIONS AND CORRESPONDING METHODS

CROSS REFERENCE TO RELATED APPLICATIONS

This application is a continuation of the copending U.S. patent application Ser. No. 14/920,107 to Meyers et al., filed Oct. 22, 2015, entitled "Organometallic Solution Based High Resolution Patterning Compositions And Corresponding Methods", which claims priority to U.S. provisional patent application 62/067,552 filed on Oct. 23, 2014 to Meyers et al., entitled "Organo-Tin Compounds for Forming High Resolution Radiation Patternable Films, Precursor Compounds and Solutions, and Corresponding Methods," and to U.S. provisional patent application 62/119,972 filed Feb. 24, 2015 to Meyers et al., entitled "Organo-Tin Compounds for Forming High Resolution Radiation Patternable Films, Precursor Compounds and Solutions, and Corresponding Methods," all of which are incorporated herein by reference.

FIELD OF THE INVENTION

The invention relates to radiation-based methods for the performance of patterning materials using an organometallic coating composition. The invention further relates to precursor solutions that can be deposited to form organometallic coatings that can be patterned with very high resolution with radiation and to the coated substrates and coatings formed with the precursor solutions before and after patterning.

BACKGROUND OF THE INVENTION

For the formation of semiconductor-based devices as well as other electronic devices or other complex fine structures, materials are generally patterned to integrate the structure. Thus, the structures are generally formed through an iterative process of sequential deposition and etching steps through which a pattern is formed of the various materials. In this way, a large number of devices can be formed into a small area. Some advances in the art can involve that reduction of the footprint for devices, which can be desirable to enhance performance.

Organic compositions can be used as radiation patterned resists so that a radiation pattern is used to alter the chemical structure of the organic compositions corresponding with the pattern. For example, processes for the patterning of semiconductor wafers can entail lithographic transfer of a desired image from a thin film of organic radiation-sensitive material. The patterning of the resist generally involves several steps including exposing the resist to a selected energy source, such as through a mask, to record a latent image and then developing and removing selected regions of the resist. For a positive-tone resist, the exposed regions are transformed to make such regions selectively removable, while for a negative-tone resist, the unexposed regions are more readily removable.

Generally, the pattern can be developed with radiation, a reactive gas, or liquid solution to remove the selectively sensitive portion of the resist while the other portions of the resist act as a protective etch-resistant layer. Liquid developers can be particularly effective for developing the latent image. The substrate can be selectively etched through the windows or gaps in the remaining areas of the protective resist layer. Alternatively, desired materials can be deposited into the exposed regions of the underlying substrate through the developed windows or gaps in the remaining areas of the protective resist layer. Ultimately, the protective resist layer is removed. The process can be repeated to form additional layers of patterned material. The functional inorganic materials can be deposited using chemical vapor deposition, physical vapor deposition or other desired approaches. Additional processing steps can be used, such as the deposition of conductive materials or implantation of dopants. In the fields of micro- and nanofabrication, feature sizes in integrated circuits have become very small to achieve high-integration densities and improve circuit function.

SUMMARY OF THE INVENTION

In a first aspect, the invention pertains to a coating solution comprising an organic solvent and a first organometallic compound represented by the formula $RSnO_{(3/2-x/2)}(OH)_x$ where $(0<x<3)$ with from about 0.0025M to about 1.5M tin in the solution, where R is an alkyl group or cycloalkyl group with 3-31 carbon atoms, where the alkyl or cycloalkyl group is bonded to the tin at a secondary or tertiary carbon atom.

In a further aspect, the invention pertains to a coating solution comprising an organic solvent, a first organometallic compound represented by the formula $RSnO_{(3/2-x/2)}(OH)_x$ where $(0<x<3)$, where R is an alkyl group or cycloalkyl group with 3-31 carbon atoms, where the alkyl or cycloalkyl group is bonded to the tin at a secondary or tertiary carbon atom, and a second organometallic compound distinct from the first organometallic compound and represented by the formula $R'SnO_{(3/2-x/2)}(OH)_x$ where $(0<x<3)$, where R' is a linear or branched alkyl or cycloalkyl group and wherein R and R' are not the same.

In another aspect, the invention pertains to a method for patterning a film on a substrate, the method comprising:

exposing the film with EUV doses of no more than about 80 mJ/cm$^2$; and developing the film to form features at half-pitch no more than about 25 nm and linewidth roughness no more than about 5 nm.

In an additional aspect, the invention pertains to a method for patterning an organometallic film on a substrate, the method comprising:

exposing the organometallic film to EUV radiation at a dose-to-gel value of no more than about 15 mJ/cm$^2$ to obtain a contrast of at least about 6.

Moreover, the invention pertains to a patterned structure comprising a substrate having a surface and a coating associated with the surface wherein at least portions of the coating are represented by the formulation $(R)_zSnO_{2-z/2-x/2}(OH)_x$ $(0<(x+z)<4)$, where R is an alkyl group or cycloalkyl group with 3-31 carbon atoms, where the alkyl or cycloalkyl group is bonded to the tin at a secondary or tertiary carbon atom.

In a further aspect, the invention pertains to a solution comprising a solvent and a compound represented by the formula $RSnO_{(3/2-x/2)}(OH)_x$ where $(0<x<3)$, where R is an alkyl, cycloalkyl or substituted alkyl moiety having from 1 to 31 carbon atoms, the solution having individual concentrations of contaminant metals of no more than about 1 ppm by weight.

Additionally, the invention pertains to a method for synthesizing a compound represented by the formula RSnOOH or RSnO$_{(3/2-x/2)}$(OH)$_x$ (0<x<3), where R is an alkyl or cycloalkyl moiety having from 1 to 31 carbon atoms, the method comprising:

hydrolyzing a precursor composition having the formula RSnX$_3$, where X represents a halide atom (F, Cl, Br or I), or amido group(s), or combinations thereof wherein the hydrolysis is performed with sufficient water to effectuate the hydrolysis, wherein the hydrolysis product has individual concentrations of metals other than tin of no more than about 1 ppm by weight.

BRIEF DESCRIPTION OF THE DRAWINGS

FIG. 1 is a schematic perspective view of a radiation patterned structure with a latent image.

FIG. 2 is a side plan view of the structure of FIG. 1.

FIG. 3 is a schematic perspective view of the structure of FIG. 1 after development of the latent image to remove un-irradiated coating material to form a patterned structure.

FIG. 4 is a side view of the patterned structure of FIG. 3.

DETAILED DESCRIPTION OF THE INVENTION

Figure 5:
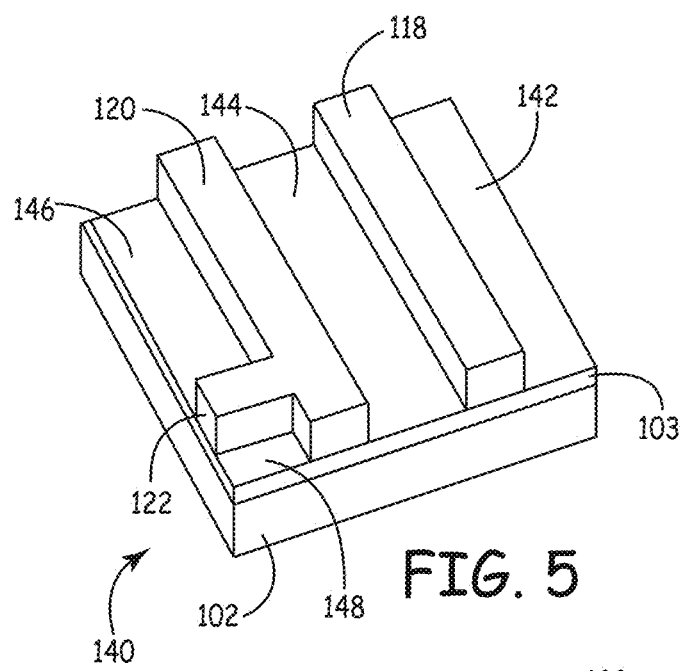
FIG. 5 is a schematic perspective view of the structure of FIG. 1 after development of the latent image to remove irradiated coating material to form a patterned structure.

It has been discovered that organo-tin compounds with bonds to alkyl groups, especially branched alkyl groups (including cyclic ligands), can be used as improved radiation patterned precursor film forming compounds. Films formed with the compounds can be patterned with desirable doses of radiation to achieve very high resolution patterns. The ligand structure for the organo-tin compounds provides for good precursor solution stability and good radiation sensitivity upon forming a coating. While alkyl-tin compounds with branched alkyl ligands have been found to provide for particularly improved patterning at lower radiation doses, use of a mixture of alkyl ligands provides for further potential improvement through the engineering of several features of the resulting coatings facilitating patterning. Desirable features of coatings formed with the organometallic precursor solutions provide for large radiation absorption and superior direct patterning for the formation of a patterned metal oxide coating. Precursor solutions with low metal contamination, distinct from the metal, for example, tin, or combination of metals comprising the organometallic coating composition, provide for coating formation useful for applications where metal contamination can be unsuitable for the associated materials and devices. Appropriate processing techniques for the formation of low contaminant precursor solutions are described. Precursor solutions can be coated using appropriate techniques. Radiation patterning and development of the latent image can be performed to achieve images with a high degree of resolution and low line width roughness with very small pattern features.

Exposure to radiation alters the composition of the irradiated organometallic coating material, disrupting the structure defined by the alkyl ligands and permitting further condensation and reaction with moisture from any source, such as ambient moisture. On the basis of these chemical changes dissolution rates may vary substantially between irradiated and non-irradiated portions of the film with selection of appropriate developer compositions, facilitating either negative tone patterning or positive tone patterning with the same coating in some embodiments. In negative patterning, exposure to radiation and potential subsequent condensation converts the irradiated coating material into a material that is more resistant to removal with organic solvent-based developer compositions relative to the non-irradiated coating material. In positive patterning, exposure sufficiently changes the polarity of the exposed coating material, e.g., increasing the polarity, such that the exposed coating material can be selectively removed with an aqueous solvent or other sufficiently polar solvent. Selective removal of at least a portion of the coating material can leave a pattern where regions of coating have been removed to expose the underlying substrate. After development of the coating following irradiation, the patterned oxide materials can be used for facilitating processing in device formation with excellent pattern resolution. The coating materials can be designed to be sensitive to selected radiation, such as extreme ultraviolet light, ultraviolet light and/or electron beams. Furthermore, the precursor solutions can be formulated to be stable with an appropriate shelf life for commercial distribution.

The metal ions generally also are further bound to one or more oxo-ligands, i.e., M-O and/or hydroxo-ligands, i.e., M-O-H, in addition to the organic ligands. The alkyl ligands and the oxo/hydroxo ligands provide desirable features to precursor solution and corresponding coating by providing significant control over the condensation process to a metal oxide with resulting significant processing, patterning, and coating advantages. The use of organic solvents in the coating solutions supports the stability of the solution, while the non-aqueous solution based processing maintains the ability to selectively develop the resulting coating following the formation of a latent image with excellent development rate contrast, for both positive tone patterning and negative tone patterning due to the change in solubility of the exposed regions relative to the unexposed regions. Desirable precursor solutions with dissolved alkyl-stabilized metal ions provide for convenient solution based deposition to form a coating that can have high radiation sensitivity and excellent contrast with respect to etch resistance to allow for fine structure formation. The design of the precursor composition can provide for the formation of a coating composition with a high sensitivity to a particular radiation type and/or energy/wavelength.

The ligand structure of the precursor organometallic compositions are believed to provide the observed desirable stability of the precursor solutions as well as the radiation patterning function. In particular, it is believed that the absorption of radiation can provide for the disruption of the bonds between the metal and the organic ligands to create a differentiation of the composition at the irradiated and non-irradiated sections of the coated material. This differentiation can be further amplified by suitable processing of the exposed film prior to development, after development, or both. Thus, the compositional changes to form the improved precursor solutions also provide for improved development of the image. In particular, the irradiated coating material may result in a stable inorganic metal oxide material with a tunable response to the developer.

Through proper developer selection either positive or negative-tone images can be developed. In some embodiments, suitable developers include, for example, 2.38% TMAH, i.e., the semiconductor industry standard. The coating layers can be made thin without pattern loss during development from removing the coating material from regions where the coating material is intended to remain following development. Compared to conventional organic resists, the materials described herein have extremely high resistance to many etch chemistries for commercially relevant functional layers. This enables process simplification through avoidance of intermediate sacrificial inorganic pattern transfer layers that would otherwise be used to supplement the patterned organic resists with respect to the mask function. Also, the coating material can provide for convenient double patterning. Specifically, following a thermal treatment, patterned portions of the coating material are stable with respect to contact with many compositions including further precursor solutions. Thus, multiple patterning can be performed without removing previously deposited hard-mask or resist coating materials.

The precursor solution comprises polynuclear metal oxo/hydroxo cations and alkyl ligands. The oxo/hydroxo ligands can be introduced through the hydrolysis of corresponding compounds with halide, amido, or alkynido ligands. Metal oxo/hydroxo cations, also described as metal suboxide cations, are polyatomic cations with one or more metal atoms and covalently bonded oxygen atoms. Metal suboxide cations with peroxide based ligands are described in U.S. Pat. No. 8,415,000 to Stowers et al. (the '000 patent), entitled "Patterned Inorganic Layers, Radiation Based Patterning Compositions and Corresponding Methods," incorporated herein by reference. Aqueous solutions of metal suboxides or metal hydroxides can tend to be unstable with respect to gelling and/or precipitation. In particular, the solutions are unstable upon solvent removal and can form oxo-hydroxide networks with the metal cations. Incorporation of a radiation-sensitive ligand such as peroxide into such a solution can improve stability, but the background instability associated with network formation may persist. Any uncontrolled network formation effectively decreases the radiation sensitivity and/or development rate contrast of the coated material by providing a development rate determining pathway independent of irradiation. The use of alkyl ligands as a radiation sensitive ligand has been found to provide for improved precursor solution stability while providing for large radiation absorption and excellent contrast for formation of very fine structures.

As described herein, the use of branched alkyl ligands, such as tert-butyl or isopropyl, have been found to exhibit improved patterning performance relative to unbranched alkyl ligands. While the use of branched alkyl groups have been found to provide desirable patterning performance, in some embodiments, suitable mixtures of alkyl-tin compounds with Sn—C bonds to branched and/or unbranched alkyl groups, in particular with at least one branched alkyl group, can be formulated to further improve nanolithographic patterning performance. It is believed that the additional flexibility afforded by a mixture of alkyl ligand structures allows the selection of multiple composition properties that may not be accessible within a single ligand structure: e.g. stability, solubility, radiation sensitivity, size, etc. Thus the formulation of mixed metal ions with distinct alkyl ligands in the precursor compositions may provide the basis for a range of improved performance parameters, including the desirable patterning dose and line-width roughness values demonstrated in a subsequent example.

The use of organo-metal compounds for radiation resist coatings is described generally in published U.S. patent application 2015/0056542 to Meyers et al. ("the '542 application"), entitled "Organometallic Solution Based High Resolution Patterning Compositions," incorporated herein by reference. The '542 application exemplifies n-butylSnOOH and di-vinylSn(OH)$_2$ compositions for the formation of a radiation sensitive patterning layer, and describes the desirability of alkyl ligands involving compounds with tin, indium, antimony or a combination thereof. These general compositions are relevant for appropriate embodiments described herein. It has been discovered that branched alkyl ligands, such as tert-butyl, isopropyl, or tert-amyl (1,1-dimethylpropyl) attached to tin, and branched at the carbon of tin attachment (α-carbon branched), can be effectively used as radiation patterning resists with lower radiation doses than those containing unbranched ligands. Similarly, other alkyl and cyclo-alkyl ligands branched at the α-carbon, including 2-butyl, cyclohexyl, cyclopentyl, cyclobutyl, cyclopropyl, 1-adamantyl, and 2-adamantyl are contemplated, and within the scope of the present disclosure along with mixtures of compounds with alkyl ligands as describe herein. In other words, the resists with branched organic ligands contain alkyl or cycloalkyl ligands bonded to the Sn atom via secondary or tertiary carbon atoms, $RSnO_{(3/2-x/2)}(OH)_x$, (0<x<3), where R is a secondary or tertiary alkyl or cycloalkyl group with 3 to 31 carbon atoms. Alternatively, this composition may be expressed as $R_1R_2R_3CSnO_{(3/2-x/2)}(OH)_x$, (0<x<3), where $R_1$ and $R_2$ are independently an alkyl group with 1-10 carbon atoms, $R_3$ is hydrogen or an alkyl group with 1-10 carbon atoms in which $R_1$, $R_2$ can form a cyclic carbon chain as well as $R_3$ optionally also in a cyclic carbon structure where the ranges of carbon atoms are additive if a cyclic structure. A person or ordinary skill in the art will recognize that the order of the $R_1$, $R_2$ and $R_3$ is essentially arbitrary, so that a comparison of groups in different compounds can take into account an arbitrary reordering and does not change the compound or associated comparison of the compound. In the same concept, a compound does not avoid the scope of this formula through the arbitrary assignment of an H to $R_1$ or $R_2$ rather than $R_3$ since the formula instructs the association of a single H with $R_3$. While not wanting to be limited by theory, it is believed that the structure of these branched alkyl ligands facilitates cleavage of the Sn—C bond during exposure, thereby increasing the sensitivity of the resist to radiation. This facilitation may be attributable to the increased stability of secondary and tertiary alkyl radical or carbocation intermediates relative to related primary alkyl moieties. While not directly documented in Sn—C radiolysis studies, similar properties are evident in tabulated C—H bond-dissociation energies. Thus, the improved compositions described herein provide for significant commercial advantages through lower radiation processing to achieve high resolution patterns with low line width roughness. High resolution patterns with low line width roughness can thus be achieved with lower radiation doses for processing improvements relative to similar superior resolution and low line width roughness achieved with metal oxide based photoresists with peroxide based ligands, as described in the '000 patent cited above.

The new precursor solutions have been formulated with improved stability and control of network formation and precipitation relative to inorganic resist materials with peroxide based ligands. Characterization of ligands as radiation sensitive in this case refers to the lability of the metal-ligand bond following absorption of radiation, so that radiation can be used to induce a chemical change in the material. In particular, alkyl ligands stabilize the precursor solutions while also providing control over the processing of the materials, and selection of the ratio of alkyl ligands to metal ions can be adjusted to control properties of the solution and the resulting coatings.

The precursor compositions comprising a mixture with different alkyl ligands can comprise mixtures of two alkyl-tin compounds with different organic ligands, three alkyl-tin compounds with different organic ligands, or more than three alkyl-tin compounds with different alkyl ligands. Generally, for binary or tertiary mixtures, the mixture comprises at least about 8 mole percent of each component with distinct alkyl ligands, in some embodiments at least about 12 mole percent and in further embodiments at least about 25 mole percent of each component with distinct alkyl ligands. A person of ordinary skill in the art will recognize that additional ranges of mixture components within the explicit ranges above are contemplated and are within the present disclosure.

The alkyl ligands, especially branched alkyl ligands, stabilize the metal cation with respect to condensation in the absence of exposure. In particular, at appropriate concentrations of alkyl-based ligands, unintended formation of condensed metal oxides or metal hydroxides and related agglomerates are very slow if they spontaneously occur at all at room temperature. Based on the discovery of this stabilization property, solutions can be formed with high concentrations of radiation sensitive ligands that have good shelf stability while retaining convenient processing to form coatings. Energy from absorbed radiation can break the metal-alkyl ligand bond. As these bonds are broken, the corresponding stabilization with respect to condensation is reduced or lost, and reactive metal centers with unsaturated valence states may be created, possibly as transient intermediates, although we do not want to be limited by theory. The composition can further change through reaction with atmospheric or separately supplied $H_2O$, formation of M—OH or through condensation to form M—O—M bonds, where M represents a metal atom. Thus, chemical changes can be controlled with radiation. Compositions with high radiation sensitive ligand concentrations can be highly stable with respect to the avoidance of unintended spontaneous hydrolysis, condensation, and agglomeration.

With respect to the oxo/hydroxo ligands for the metal ions, these ligands can be formed during processing through hydrolysis. In some embodiments, the hydrolysis can involve replacement of halide ligands in a basic aqueous solution or replacement of amido ligands (—$NR_1R_2$) in water with subsequent collection of precipitated hydrolysate and/or transfer to an organic solvent. In additional or alternative embodiments, hydrolysable ligands may be replaced by hydroxo ligands derived from atmospheric moisture reacting with a precursor during coating and baking. As described herein, low metal contamination synthesis approaches can be accomplished with appropriate alternative hydrolysis approaches and high-purity alkyltin precursors. Three such approaches are described in the examples: utilizing a water reactive alkyltin compound and obtaining water for hydrolysis from the ambient atmosphere, or addition of a controlled amount of purified water to effectuate the hydrolysis in an organic solvent, or use of a base free from metal cation in concert with an alkyltin halide. One or more alternative ligands susceptible to hydrolysis by aqueous or non-aqueous acids or bases may be used in other embodiments, depending on process and synthetic considerations such as reactivity, ease of synthesis, toxicity, and other factors. In general, suitable hydrolysable ligands (X in $RSnX_3$) may include alkynides $RC\equiv C$, alkoxides $RO^-$, azides $N_3^-$, carboxylates $RCOO^-$, halides and dialkylamides.

The through the adoption of specific synthesis procedures, the precursor alkyl tin oxide hydroxide compound can be formulated with very low metal contamination. In particular, non-tin metals can generally be reduced to no more than 1 part per million by weight (ppm), and alkali and alkaline earth metals can be reduced to no more than about 100 parts per billion by weight (ppb). Solutions of the compounds can be correspondingly formed. The resulting coatings can be made that provide low risk of metal contamination to the underlying substrate, adjacent layers, devices, and process tools. The low metal contamination can provide utility for the resist compositions for applications where certain metal contamination is undesirable, for example, alkali metal contamination.

The processing approaches that allow for the formation of low metal contaminant precursors avoid the use of reactants, such as bases (e.g., NaOH), that introduce contaminant metals into the compositions. Alternative bases that can provide low metal contamination include, for example, tetramethyl ammonium hydroxide and other quaternary ammonium hydroxides. Also, water can be directly used for the hydrolysis in an organic solvent with the water provided from the atmosphere or added in a controlled amount. Given the very low trace-metal levels specified in semiconductor device manufacturing (generally <10 ppb for resist compositions), if even modest amounts of contaminant metals are introduced, techniques have not been identified to adequately remove the contaminant metals from a formulated alkyltin oxide hydroxide resist. Thus, appropriately hydrolysable ligands, e.g., halides or amides, are replaced with oxo-hydroxo ligands through alternative hydrolysis reactions that do not contribute substantial concentrations of non-tin metals. The hydrolysate can be purified to remove reaction byproducts through appropriate approaches, such as precipitation, washing, and recrystallization and/or redissolving in a suitable solvent.

Generally, the precursor coating solution can comprise sufficient radiation sensitive alkyl ligands such that the solution has a molar concentration ratio of radiation sensitive ligands to metal cations from about 0.1 to about 2. Ligand ratios in this range may be prepared by hydrolysis of $SnX_4$, $RSnX_3$ or $R_2SnX_2$ precursors in the appropriate stoichiometry, subject to the constraints of precursor stability and solubility. The coating formed from the precursor solution is influenced by the ligand structure of the ions in the precursor solution and may be an equivalent ligand structure around the metal upon drying or the ligand structure can be altered during the coating and/or drying process. The coating generally is also influenced by exposure to the radiation to enable the patterning function. In general, the coating can be represented by the formulation $(R)_z SnO_{2-z/2-x/2}(OH)_x$ ($0<(x+z)<4$), where R is an alkyl group or cycloalkyl group with 3-31 carbon atoms, where the alkyl or cycloalkyl group is bonded to the tin at a secondary or tertiary carbon atom. For unirradiated coating, the value of z can be the same or close to the coating solution value, while the irradiated coating generally has a lower value of z, which can be driven close to 0 by further heating and/or irradiation, such as following patterning. In particular, the alkyl ligand concentrations provide for a surprisingly large improvement in the precursor stability and control in network formation with solutions formed with organic solvents, generally polar organic solvents. While not wanting to be limited by theory, a radiation sensitive, low polarity ligand concentration in the appropriate range evidently reduces unintended condensation and agglomeration of the metal cations with corresponding oxo-ligands and/or hydroxo-ligands, to stabilize the solution. Thus, the precursor coating solution can be stable relative to settling of solids without further stirring for at least one week and possibly for significantly longer periods of time, such as greater than a month. Due to the long stability times, the alkyltin oxide hydroxide precursors have increased versatility with respect to potential commercial uses. The overall molar concentration can be selected to achieve a desired coating thickness and desired coating properties, which can be obtained consistent with desired stability levels.

The polyatomic metal oxo/hydroxo cations with alkyl ligands can be selected to achieve the desired radiation absorption. In particular, tin based coating materials exhibit good absorption of far ultraviolet light at a 193 nm wavelength and extreme ultraviolet light at a 13.5 nm wavelength. Table 1 lists optical constants (n=index of refraction and k=extinction coefficient) at selected wavelengths for a coating material formed from monobutyltin oxide hydrate and baked at 100° C.

TABLE 1

| Wavelength (nm) | n | k |
| --- | --- | --- |
| 193 | 1.75 | 0.211 |
| 248 | 1.79 | 0.0389 |
| 365 | 1.63 | 0 |
| 405 | 1.62 | 0 |
| 436 | 1.61 | 0 |

To correspondingly provide a high absorption of radiation generally used for patterning, it is desirable to include Sn, In and Sb metals in the precursor solutions, although these metals can be combined with other metals to adjust the properties, especially the radiation absorption. Hf provides good absorption of electron beam material and extreme UV radiation and In and Sb provide strong absorption of extreme ultraviolet light at 13.5 nm. For example, one or more metal compositions comprising Ti, V, Mo, or W or combinations thereof can be added to the precursor solution to form a coating material with an absorption edge moved to longer wavelengths, to provide, for example, sensitivity to 248 nm wavelength ultraviolet light. These other metal ions may or may not involve an alkyl ligand, and suitable salts for the metal ions without alkyl ligands for use in the precursor compositions described herein may include, for example, organic or inorganic salts, amides, alkoxides, or the like that are soluble in the solvent for the coating precursor solution. For the determination of metal contaminants, clearly specifically added functional metals are not considered as contaminants, and these metals can generally be identified by a presence in the precursor solutions at a level greater than 100 ppm by weight, and such metals can be selected to avoid undesirable contamination for a particular application.

In general, the desired hydrolysate can be dissolved in an organic solvent, e.g., alcohols, esters or combinations thereof to form the precursor solution. The concentrations of the species in the coating solutions can be selected to achieve desired physical properties of the solution. In particular, lower concentrations overall can result in desirable properties of the solution for certain coating approaches, such as spin coating, that can achieve thinner coatings using reasonable coating parameters. It can be desirable to use thinner coatings to achieve ultrafine patterning as well as to reduce material costs. In general, the concentration can be selected to be appropriate for the selected coating approach. Coating properties are described further below.

The precursor solutions can be deposited generally with any reasonable coating or printing technique as described further below. The coating generally is dried, and heat can be applied to stabilize or partially condense the coating prior to irradiation. Generally, the coatings are thin, such as with an average thickness of less than 10 microns, and very thin submicron coatings, for example, no more than about 100 nanometers (nm), can be desirable to pattern very small features. To form high resolution patterns, radiation sensitive organic compositions can be used to introduce patterns, and the compositions can be referred to as resists since portions of the composition are processed to be resistant to development/etching such that selective material removal can be used to introduce a selected pattern. The dried coating can be subjected to appropriate radiation, e.g., extreme ultraviolet light, e-beam or ultraviolet light, with the selected pattern or the negative of the pattern to form a latent image with developer resistant regions and developer dissolvable regions. After exposure to appropriate radiation, and prior to developing, the coating can be heated or otherwise reacted to further differentiate the latent image from non-irradiated areas. The latent image is contacted with the developer to form a physical image, i.e. a patterned coating. The patterned coating can be further heated to stabilize the remaining coating patterned on the surface. The patterned coating can be used as a physical mask to perform further processing, e.g., etching of the substrate and/or deposition of additional materials according to the pattern. At appropriate points of the processing after using the patterned resist as desired, the remaining patterned coating can be removed, although the patterned coating can be incorporated into the ultimate structure. Very fine features can be accomplished effectively with the patterning compositions described herein.

In some embodiments, the resulting patterned material can be incorporated into the structure following appropriate stabilization through at least some condensation into an inorganic metal oxide material, as a component of ultimate device(s). If the patterned inorganic coating material is incorporated into the structure, for example as a stable dielectric layer, many steps of the processing procedure can be eliminated through the use of a direct patterning of the material with radiation. In general, it has been found that very high resolution structures can be formed using thin inorganic coating materials exposed using short wavelength electromagnetic radiation and/or electron beams, and that line-width roughness can be reduced to very low levels for the formation of improved patterned structures.

Refined precursor solutions with greater stability also provide for a coating material having the potential of a greater development rate contrast between the radiation exposed and unexposed portions of the substrate, which surprisingly can be achieved simultaneously with either positive tone patterning or negative tone patterning. Specifically, the irradiated coating material or the un-irradiated coating material can be relatively more easily dissolved by suitable developer compositions. Thus, with the improved compositions and corresponding materials, positive- or negative-tone imaging can be achieved through choice of developer. At the same time, the pitch can be made very small between adjacent elements with appropriate isolation, generally electrical isolation, between the adjacent elements. The irradiated coating composition can be very sensitive to a subsequent development/etching process so that the coating composition can be made very thin without compromising the efficacy of the development process with respect to selective and clean removal of the coating composition while leaving appropriate portions of the irradiated patterning composition on the surface of the substrate. The ability to shorten the exposure time to the developer further is consistent with the use of thin coatings without damaging the patterned portions of the coating.

The formation of integrated electronic devices and the like generally involves the patterning of the materials to form individual elements or components within the structures. This patterning can involve different compositions covering selected portions of stacked layers that interface with each other vertically and/or horizontally to induce desired functionality. The various materials can comprise semiconductors, which can have selected dopants, dielectrics, electrical conductors and/or other types of materials. The radiation sensitive organometallic compositions described herein can be used for the direct formation of desired inorganic material structures within the device and/or as a radiation patternable inorganic resist that is a replacement for an organic resist. In either case, significant processing improvements can be exploited, and the structure of the patterned material can be also improved.

Precursor Solutions

The precursor solutions for forming the resist coatings generally comprise tin cations with appropriate alkyl stabilizing ligands in a solvent, generally an organic solvent. The precursor solutions and the ultimate resist coatings are based on metal oxide chemistry, and the organic solutions of metal polycations with alkyl ligands provide stable solutions with good resist properties. Branched alkyl ligands in particular provide improved patterning capability. The ligands provide the radiation sensitivity, and the particular selection of ligands can influence the radiation sensitivity. Also, the precursor solutions can be designed to achieve desired levels of radiation absorption for a selected radiation based on the selection of the metal cations as well as the associated ligands. The concentration of ligand stabilized metal cations in the solution can be selected to provide suitable solution properties for a particular deposition approach, such as spin coating. The precursor solutions have been formulated to achieve very high levels of stability such that the precursor solutions have appropriate shelf lives for commercial products. As described in the following section, the precursor solutions can be applied to a substrate surface, dried and further processed to form an effective radiation resist. The precursor solutions are designed to form a coating composition upon at least partial solvent removal and ultimately an inorganic solid dominated by tin oxides upon irradiation and/or thermal treatment, exposure to a plasma, or similar processing.

The precursor solutions generally comprise one or more tin cations. In aqueous solutions, metal cations are hydrated due to interactions with the water molecules, and hydrolysis can take place to bond oxygen atoms to the metal ion to form hydroxide ligands or oxo bonds with the corresponding release of hydrogen ions. The nature of the interactions is generally pH dependent. As additional hydrolysis takes place in aqueous solutions, the solutions can become unstable with respect to precipitation of the metal oxide or with respect to gelation. Ultimately, it is desirable to form the oxide material, but this progression can be controlled better with the precursor solutions based on organic solvents with alkyl ligand stabilized metal cations. If placed over an atmosphere with water vapor, the solvent may comprise some dissolved water in equilibrium with the partial pressure of water in contact with the solvent, and the examples demonstrate the use of dissolved water to effect controlled hydrolysis of hydrolysable ligands. With the precursor solutions based on alkyl-stabilization ligands and an organic solvent, progression to the oxide can be controlled as part of the procedure for processing the solution first to a coating material and then to the ultimate metal oxide composition with organic ligands. As described herein, alkyl ligands, especially branched alkyl ligands and/or combinations of alkyl ligands, can be used to provide significant control to the processing of the solution to an effective radiation resist composition.

In general, the precursor compounds can be represented by the formula $RSnO_{(3/2-x/2)}(OH)_x$, ($0<x<3$) where R is a linear or branched (i.e., secondary or tertiary at the metal bonded carbon atom) alkyl group. R generally has from 1 to 31 carbon atoms with 3 to 31 carbon atoms for the branched embodiments. In particular, branched alkyl ligands are desirable where the compound can be represented in another representation by $R_1R_2R_3CSnO_{(3/2-x/2)}(OH)_x$, ($0<x<3$) where $R_1$ and $R_2$ are independently an alkyl group with 1-10 carbon atoms, and $R_3$ is hydrogen or an alkyl group with 1-10 carbon atoms. In some embodiments $R_1$ and $R_2$ can form a cyclic alkyl moiety, and $R_3$ may also join the other groups in a cyclic moiety. Precursor solutions may also comprise blends of compositions with different alkyl ligands Exemplified branched alkyl ligands include isopropyl ($R_1$ and $R_2$ are methyl and $R_3$ is hydrogen), tert-butyl ($R_1$, $R_2$ and $R_3$ are methyl), sec-butyl ($R_1$ is methyl, $R_2$ is —CHCH$_3$, and $R_3$ is hydrogen) and tert-amyl ($R_1$ and $R_2$ are methyl and $R_3$ is —CHCH$_3$). Preliminary experiments with cyclic alkyl ligands have shown promising results. Examples of suitable cyclic groups include, for example, 1-adamantyl (—C(CH$_2$)$_3$(CH)$_3$(CH$_2$)$_3$ or tricyclo(3.3.1.13,7) decane bonded to the metal at tertiary carbon) and 2-adamantyl (—CH(CH)$_2$(CH$_2$)$_4$(CH)$_2$(CH$_2$) or tricyclo(3.3.1.13,7) decane bonded to the metal at a secondary carbon). Thus, the solutions of the metal cations are poised for further processing. In particular, it can be desirous to use as an added component of the precursor solution, a polynuclear tin oxo/hydroxo cation that can poise the solution further toward a tin oxide composition. In general, the precursor solution comprises from about 0.01M to about 1.4M metal polynuclear oxo/hydroxo cation, in further embodiments from about 0.05M to about 1.2M, and in additional embodiments from about 0.1M to about 1.0M. A person of ordinary skill in the art will recognize that additional ranges of tin polynuclear oxo/hydroxo cations within the explicit ranges above are contemplated and are within the present disclosure.

The precursor compositions comprising a mixture with different organic ligands can comprise mixtures of two alkyl-tin compounds with different alkyl ligands, three alkyl-tin compounds with different alkyl ligands, or more than three alkyl-tin compounds with different alkyl ligands. Generally, for binary or tertiary mixtures, the mixture comprises at least about 8 mole percent of each component with distinct allyl ligands, in some embodiments at least about 12 mole percent and in further embodiments at least about 25 mole percent of each component with distinct alkyl ligands. A person of ordinary skill in the art will recognize that additional ranges of mixture components within the explicit ranges above are contemplated and are within the present disclosure.

The metal generally significantly influences the absorption of radiation. Tin provides strong absorption of extreme ultraviolet light at 13.5 nm. In combination with alkyl ligands, the cations also provide good absorption of ultraviolet light at 193 nm wavelength. Tin also provides good absorption of electron beam radiation. The energy absorbed is modulated by the metal-organic interactions, which can result in the rupturing of the metal-ligand and the desired control over the material properties.

The alkyl ligands stabilize the composition with respect to unintended spontaneous condensation and agglomeration of the hydrolysate. In particular, at high relative concentration of alkyl ligands, formation of condensed metal oxides or metal hydroxides are very slow if the condensation spontaneously occurs at all at room temperature. Based on the discovery of this stabilization property, hydrolysate solutions can be formed with high concentrations of radiation sensitive ligands that have good shelf stability while retaining convenient processing to form coatings. Radiation sensitive ligands include alkyl moieties forming a tin-carbon bond. Energy from absorbed radiation can break the tin-alkyl ligand bond. As these bonds are broken, the corresponding stabilization with respect to condensation is reduced or lost. The composition can change through formation of M—OH or through condensation to form M-O-M bonds, where M represents a metal atom. Thus, chemical changes can be controlled with radiation. Compositions with high radiation sensitive ligand concentrations can be highly stable with respect to the avoidance of spontaneous formation of hydroxide and condensation.

Some suitable metal compositions with desired ligand structures can be purchased from commercial sources, such as Alfa Aesar (MA, USA) and TCI America (OR, USA), see Examples below, and other metal-ligand compositions can be synthesized as described below. Low metal contaminant precursor compositions are synthesized using the methods described herein.

In general, alkyl ligands can be, for example, methyl, ethyl, propyl, butyl, and branched alkyl. Suitable branched alkyl ligands can be, for example, isopropyl, tert-butyl, tert-amyl, 2-butyl, cyclohexyl, cyclopentyl, cyclobutyl, cyclopropyl, 1-adamantyl or 2-adamantyl. Improved patterning results have been obtained using branched alkyl ligands. But fuller advantage of ligand selection has been achieved through the use of mixed alkyl ligands, as separately advantageous patterning properties such as dose and line-width-roughness imparted by different ligands may be obtained through the teachings herein through blending of multiple alkyl ligands as illustrated in the examples provided.

It has been found that the radiation curing doses can scale approximately linearly for mixtures of precursor compounds with different alkyl ligands based on the radiation doses for the respective individual precursor compounds. Due to the lower radiation doses that can be used with the branched alkyl ligands, it is generally desirable for the mixtures to comprise at least one branched organic ligand. But correspondingly it has been discovered that the line width roughness can be improved with mixtures of precursor compounds with different organic ligands. While not wanting to be limited by theory, it is possible that the improved line width roughness values observed for the mixture compositions may be due to facilitated etchings for the mixture compositions without significantly diminishing the contrast in the pattern. In this context, the observations may extend to mixture compositions containing combinations of organo-tin compounds bearing branched or unbranched alkyls.

As described herein, processing approaches have been developed that provide for reduction of metal contamination. Thus, the precursor solutions can be formulated that have very low levels of non-tin metal. In general, the non-tin metal concentrations can all be individually reduced to values of no more than about 1 part per million by weight (ppm) in further embodiments, no more than about 200 parts per billion by weight (ppb), in additional embodiments no more than about 50 ppb, and in other embodiments no more than about 10 ppb. In some embodiments, it may be desirable to add other metal elements to influence processing, and generally these can be identified by levels of at least about 1 weight percent and in some embodiments at least about 2 weight percent, and can thus be distinguished from contaminant metals, if appropriate. Metal contaminants to be decreased in particular include alkali metals and alkaline earth metals, Au, Ag, Cu, Fe, Pd, Pt, Co, Mn, and Ni. A person or ordinary skill in the art will recognize that additional ranges of metal levels within the explicit levels above are contemplated and are within the present disclosure.

Processing to form the organotin oxide hydroxide compositions has previously involved use of reactants that introduce significant non-tin metal contaminants, such as sodium from sodium hydroxide base. The alternative synthesis methods described herein can be used for preparing hydrolysates with linear or branched alkyl ligands, including compounds not known to be commercially available as well as corresponding commercially available compounds that may have metal contaminants. Ways to remove the sodium to a sufficiently low level have not been found, so alternative synthesis techniques have been developed. Thus, alternative processes have been developed that allow for the significant reduction of metal contamination. In particular, high-purity water-reactive precursor compounds that do not require added base to form an organotin hydrolysate may be used. Hydrolysate syntheses can be performed in a non-aqueous solvent or with an aqueous solvent where the product compounds immediately precipitate. In some embodiments, water can be introduced in just a sufficient amount to hydrolyse the hydrolysable ligands to form the desired alkyl tin oxide hydroxide compound.

With respect to the oxo/hydroxo ligands for the metal ions, these ligands can be formed during processing through hydrolysis. In some embodiments, the hydrolysis can involve replacement of hydrolysable ligands to form oxo (O) and/or hydroxo (—OH) ligands. For example, halide ligands can be hydrolysed in a basic aqueous solution with subsequent transfer to an organic solvent. However, for the production of precursor compositions with low metal contamination, performing the hydrolysis using alternative reactions has been found to be desirable. Specific examples are presented below.

In some embodiments, a composition comprising the tin ions with organic stabilizing ligands and hydrolysable ligands are dissolved in an organic solvent, which is then contacted with a basic aqueous solution, whereupon substitution of the hydrolysable ligands with hydroxo ligands may occur. After providing enough time to form hydroxo ligands, the aqueous solution can be separated from the organic phase assuming that the organic liquid is not soluble in the aqueous liquid. In some embodiments, the oxo/hydroxo ligands can be formed through hydrolysis from atmospheric water. The hydrolysable metal ion composition can be heated in the presence of atmospheric moisture so that the oxo/hydroxo ligands form directly in the coating material, which can be relatively facile due to the high surface area. An example of hydrolysis from atmospheric water is also described below. In additional or alternative embodiments, sufficient water to effectuate the hydrolysis is dissolved into an organic solvent along with the precursor compound with the hydrolysable ligands.

To form the precursor compound with the alkyl ligands and hydrolysable ligands, M-C bonds can also be formed in a solution phase substitution reaction. The following reactions are representative suitable reactions for the substitution reactions to form Sn—C bonds:

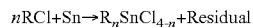

$n\text{RCl} + \text{Sn} \rightarrow R_n\text{SnCl}_{4-n} + \text{Residual}$

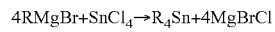

$4\text{RMgBr} + \text{SnCl}_4 \rightarrow R_4\text{Sn} + 4\text{MgBrCl}$

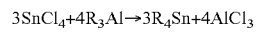

$3\text{SnCl}_4 + 4R_3\text{Al} \rightarrow 3R_4\text{Sn} + 4\text{AlCl}_3$

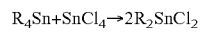

$R_4\text{Sn} + \text{SnCl}_4 \rightarrow 2R_2\text{SnCl}_2$ where R represents an alky ligand. Generally, different suitable halides can be substituted in the above reactions. The reactions can be carried out in a suitable organic solvent in which the reactants have reasonable solubility.

With respect to methods for forming low metal contaminant precursor solutions, reactants are chosen to avoid introduction of metal contaminants during the hydrolysis reactions to form the tin oxide hydroxide compounds from the alkyl tin compounds with hydrolysable groups. Two general approaches are used successfully in the examples. In some embodiments, the hydrolysis is performed with the precursor compounds in an organic solvent and sufficient water to effectuate the hydrolysis is introduced. The sufficient water to complete the hydrolysis of the hydrolysable ligands can be introduced from the ambient water vapor or injected into the organic solvent and mixed. Alternatively, the hydrolysis can be performed in water in which catalytic base is introduced in a form that does not introduce metal contaminants. For example, in the examples, aqueous tetramethylammonium hydroxide (TMAH) is used, which is available commercially with low metal contamination due to use in the semiconductor industry. Hydrolysable ligands can be selected appropriately for the specific approach used for the hydrolysis reaction as described in the examples.

In general, the desired hydolysate compounds can be dissolved in an organic solvent, e.g., alcohols, esters or combinations thereof. In particular, suitable solvents include, for example, aromatic compounds (e.g., xylenes, toluene), ethers (anisole, tetrahydrofuran), esters (propylene glycol monomethyl ether acetate, ethyl acetate, ethyl lactate), alcohols (e.g., 4-methyl-2-propanol, 1-butanol, methanol, isopropyl alcohol, 1-propanol), ketones (e.g., methyl ethyl ketone), mixtures thereof, and the like. In general, organic solvent selection can be influenced by solubility parameters, volatility, flammability, toxicity, viscosity and potential chemical interactions with other processing materials. After the components of the solution are dissolved and combined, the character of the species may change as a result of partial hydration and condensation, especially during the coating process. When the composition of the solution is referenced herein, the reference is to the components as added to the solution, since complex formulations may produce metal polynuclear species in solution that may not be well characterized. For certain applications it is desirable for the organic solvent to have a flash point of no less than about 10° C., in further embodiments no less than about 20° C. and in further embodiment no less than about 25° C. and a vapor pressure at 20° C. of no more than about 10 kPa, in some embodiments no more than about 8 kPa and in further embodiments no more than about 6 kPa. A person of ordinary skill in the art will recognize that additional ranges of flash point and vapor pressure within the explicit ranges above are contemplated and are within the present disclosure.

In general, precursor solutions are well mixed using appropriate mixing apparatuses suitable for the volume of material being formed. Suitable filtration can be used to remove any contaminants or other components that do not appropriately dissolve. In some embodiments, it may be desirable to form separate solutions that can be combined to form the precursor solution from the combination. Specifically, separate solutions can be formed comprising one or more of the following: the metal polynuclear oxo/hydroxo cations, any additional metal cations, and the organic ligands. If multiple metal cations are introduced, the multiple metal cations can be introduced into the same solution and/or in separate solutions. Generally, the separate solutions or the combined solutions can be well mixed. In some embodiments, the metal cation solution is then mixed with the organic-based ligand solution such that the organic-based ligand can conjugate with the metal cations. The resulting solution can be referred to as a stabilized metal cation solution. In some embodiments, the stabilized metal cation solution is allowed to react for a suitable period of time to provide for stable ligand formation, which may or may not also involve cluster formation in solution, whether or not mixed metal ions are introduced. In some embodiments, the reaction or stabilization time for the solution can be for at least about five minutes, in other embodiments at least about 1 hour, and in further embodiments from about 2 hours to about 48 hours prior to further processing. A person of ordinary skill in the art will recognize that additional ranges of stabilization periods are contemplated and are within the present disclosure.

The concentrations of the species in the precursor solutions can be selected to achieve desired physical properties of the solution. In particular, lower concentrations overall can result in desirable properties of the solution for certain coating approaches, such as spin coating, that can achieve thinner coatings using reasonable coating parameters. It can be desirable to use thinner coatings to achieve ultrafine patterning as well as to reduce material costs. In general, the concentration can be selected to be appropriate for the selected coating approach. Coating properties are described further below.

Stability of the precursor solutions can be evaluated with respect to changes relative to the initial solution. Specifically, a solution has lost stability if phase separation occurs with the production of large sol particles or if the solution loses its ability to perform desired pattern formation. Based on the improved stabilization approaches described herein, the solutions can be stable for at least about a week without additional mixing, in further embodiments at least about 2 weeks, in other embodiments at least about 4 weeks. A person of ordinary skill in the art will recognize that additional ranges of stabilization times are contemplated and are within the present disclosure. The solutions can be formulated with sufficient stabilization times that the solutions can be commercially distributed with appropriate shelf lives.

Coating Material

A coating material is formed through the deposition and subsequent processing of the precursor solution onto a selected substrate. A substrate generally presents a surface onto which the coating material can be deposited, and the substrate may comprise a plurality of layers in which the surface relates to an upper most layer. In some embodiments, the substrate surface can be treated to prepare the surface for adhesion of the coating material. Also, the surface can be cleaned and/or smoothed as appropriate. Suitable substrate surfaces can comprise any reasonable material. Some substrates of particular interest include, for example, silicon wafers, silica substrates, other inorganic materials such as ceramic materials, polymer substrates, such as organic polymers, composites thereof and combinations thereof across a surface and/or in layers of the substrate. Wafers, such as relatively thin cylindrical structures, can be convenient, although any reasonable shaped structure can be used. Polymer substrates or substrates with polymer layers on non-polymer structures can be desirable for certain applications based on their low cost and flexibility, and suitable polymers can be selected based on the relatively low processing temperatures that can be used for the processing of the patternable materials described herein. Suitable polymers can include, for example, polycarbonates, polyimides, polyesters, polyalkenes, copolymers thereof and mixtures thereof. In general, it is desirable for the substrate to have a flat surface, especially for high resolution applications. However, in specific embodiments the substrate may possess substantial topography, where the resist coating is intended to fill or planarize features for particular patterning applications. Such a function of the resist material is described in published U.S. patent application 2015/0253667A1 to Bristol et al., entitled "Pre-Patterned Hard Mask for Ultrafast Lithographic Imaging," incorporated herein by reference.

In general, any suitable coating process can be used to deliver the precursor solution to a substrate. Suitable coating approaches can include, for example, spin coating, spray coating, dip coating, knife edge coating, printing approaches, such as inkjet printing and screen printing, and the like. Some of these coating approaches form patterns of coating material during the coating process, although the resolution available currently from printing or the like has a significantly lower level of resolution than available from radiation based patterning as described herein. The coating material can be applied in multiple coating steps to provide greater control over the coating process. For example, multiple spin coatings can be performed to yield an ultimate coating thickness desired. The heat processing described below can be applied after each coating step or after a plurality of coating steps.

If patterning is performed using radiation, spin coating can be a desirable approach to cover the substrate relatively uniformly, although there can be edge effects. In some embodiments, a wafer can be spun at rates from about 500 rpm to about 10,000 rpm, in further embodiments from about 1000 rpm to about 7500 rpm and in additional embodiments from about 2000 rpm to about 6000 rpm. The spinning speed can be adjusted to obtain a desired coating thickness. The spin coating can be performed for times from about 5 seconds to about 5 minutes and in further embodiments from about 15 seconds to about 2 minutes. An initial low speed spin, e.g. at 50 rpm to 250 rpm, can be used to perform an initial bulk spreading of the composition across the substrate. A back side rinse, edge bead removal step or the like can be performed with water or other suitable solvent to remove any edge bead. A person or ordinary skill in the art will recognize that additional ranges of spin coating parameters within the explicit ranges above are contemplated and are within the present disclosure.

The thickness of the coating generally can be a function of the precursor solution concentration, viscosity and the spin speed for spin coating. For other coating processes, the thickness can generally also be adjusted through the selection of the coating parameters. In some embodiments, it can be desirable to use a thin coating to facilitate formation of small and highly resolved features in the subsequent patterning process. For example, the coating materials after drying can have an average thickness of no more than about 10 microns, in other embodiments no more than about 1 micron, in further embodiments no more than about 250 nanometers (nm), in additional embodiments from about 1 nanometers (nm) to about 50 nm, in other embodiments from about 2 nm to about 40 nm and in some embodiments from about 3 nm to about 25 nm. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the film. In general, the coatings are relatively uniform to facilitate processing. In some embodiments, the variation in thickness of the coating varies by no more than ±50% from the average coating thickness, in further embodiments no more than ±40% and in additional embodiments no more than about ±25% relative to the average coating thickness. In some embodiments, such as high uniformity coatings on larger substrates, the evaluation of coating uniformity may be evaluated with a 1 centimeter edge exclusion, i.e., the coating uniformity is not evaluated for portions of the coating within 1 centimeter of the edge. A person of ordinary skill in the art will recognize that additional ranges within the explicit ranges above are contemplated and are within the present disclosure.

The coating process itself can result in the evaporation of a portion of the solvent since many coating processes form droplets or other forms of the coating material with larger surface areas and/or movement of the solution that stimulates evaporation. The loss of solvent tends to increase the viscosity of the coating material as the concentration of the species in the material increases. An objective during the coating process can be to remove sufficient solvent to stabilize the coating material for further processing. These species may condense during coating or subsequent heating to forming a hydrolysate coating material. In general, the coating material can be heated prior to radiation exposure to further drive off solvent and promote densification of the coating material. The dried coating material may generally form a polymeric metal oxo/hydroxo network based on the oxo-hydroxo ligands to the metals in which the metals also have some alkyl ligands, or a molecular solid comprised of polynuclear metal oxo/hydroxo species with alkyl ligands.

The solvent removal process may or may not be quantitatively controlled with respect to specific amounts of solvent remaining in the coating material, and empirical evaluation of the resulting coating material properties generally can be performed to select processing conditions that are effective for the patterning process. While heating is not needed for successful application of the process, it can be desirable to heat the coated substrate to speed the processing and/or to increase the reproducibility of the process. In embodiments in which heat is applied to remove solvent, the coating material can be heated to temperatures from about 45° C. to about 250° C. and in further embodiments from about 55° C. to about 225° C. The heating for solvent removal can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of heating temperature and times within the explicit ranges above are contemplated and are within the present disclosure. As a result of the heat treatment and densification of the coating material, the coating material can exhibit an increase in index of refraction and in absorption of radiation without significant loss of contrast.

Patterned Exposure and Patterned Coating Material

The coating material can be finely patterned using radiation. As noted above, the composition of the precursor solution and thereby the corresponding coating material can be designed for sufficient absorption of a desired form of radiation. The absorption of the radiation results in energy that can break the bonds between the metal and alkyl ligands so that at least some of the alkyl ligands are no longer available to stabilize the material. Radiolysis products, including alkyl ligands or fragments may diffuse out of the film, or not, depending on process variables and the identity of such products. With the absorption of a sufficient amount of radiation, the exposed coating material condenses, i.e. forms an enhanced metal oxo/hydroxo network, which may involve water absorbed from the ambient atmosphere. The radiation generally can be delivered according to a selected pattern. The radiation pattern is transferred to a corresponding pattern or latent image in the coating material with irradiated areas and un-irradiated areas. The irradiated areas comprise chemically altered coating material, and the un-irradiated areas comprise generally the as-formed coating material. As noted below, very sharp edges can be formed upon development of the coating material with the removal of the un-irradiated coating material or alternatively with selective removal of the irradiated coating material.

Radiation generally can be directed to the coated substrate through a mask or a radiation beam can be controllably scanned across the substrate. In general, the radiation can comprise electromagnetic radiation, an electron beam (beta radiation), or other suitable radiation. In general, electromagnetic radiation can have a desired wavelength or range of wavelengths, such as visible radiation, ultraviolet radiation or x-ray radiation. The resolution achievable for the radiation pattern is generally dependent on the radiation wavelength, and a higher resolution pattern generally can be achieved with shorter wavelength radiation. Thus, it can be desirable to use ultraviolet light, x-ray radiation or an electron beam to achieve particularly high resolution patterns.

Following International Standard ISO 21348 (2007) incorporated herein by reference, ultraviolet light extends between wavelengths of greater than or equal 100 nm and less than 400 nm. A krypton fluoride laser can be used as a source for 248 nm ultraviolet light. The ultraviolet range can be subdivided in several ways under accepted Standards, such as extreme ultraviolet (EUV) from greater than or equal 10 nm to less than 121 nm and far ultraviolet (FUV) from greater than or equal to 122 nm to less than 200 nm A 193 nm line from an argon fluoride laser can be used as a radiation source in the FUV. EUV light has been used for lithography at 13.5 nm, and this light is generated from a Xe or Sn plasma source excited using high energy lasers or discharge pulses. Soft x-rays can be defined from greater than or equal 0.1 nm to less than 10 nm.

The amount of electromagnetic radiation can be characterized by a fluence or dose which is obtained by the integrated radiative flux over the exposure time. Suitable radiation fluences can be from about 1 mJ/cm$^2$ to about 150 mJ/cm$^2$, in further embodiments from about 2 mJ/cm$^2$ to about 100 mJ/cm$^2$, and in further embodiments from about 3 mJ/cm$^2$ to about 50 mJ/cm$^2$. A person of ordinary skill in the art will recognize that additional ranges of radiation fluences within the explicit ranges above are contemplated and are within the present disclosure.

With electron beam lithography, the electron beam generally induces secondary electrons which generally modify the irradiated material. The resolution can be a function at least in part of the range of the secondary electrons in the material in which a higher resolution is generally believed to result from a shorter range of the secondary electrons. Based on high resolution achievable with electron lithography using the inorganic coating materials described herein, the range of the secondary electrons in the inorganic material is limited. Electron beams can be characterized by the energy of the beam, and suitable energies can range from about 5 V to about 200 kV (kilovolt) and in further embodiments from about 7.5 V to about 100 kV. Proximity-corrected beam doses at 30 kV can range from about 0.1 microcoulombs per centimeter squared to about 5 millicoulombs per centimeter squared (mC/cm$^2$), in further embodiments from about 0.5 μC/cm$^2$ to about 1 mC/cm$^2$ and in other embodiments from about 1 μC/cm$^2$ to about 100 μC/cm$^2$. A person of ordinary skill in the art can compute corresponding doses at other beam energies based on the teachings herein and will recognize that additional ranges of electron beam properties within the explicit ranges above are contemplated and are within the present disclosure.

Based on the design of the coating material, there is a large contrast of material properties between the irradiated regions that have condensed coating material and the un-irradiated, coating material with substantially intact organic ligands. It has been found that the contrast at a given dose can be improved with a post-irradiation heat treatment, although satisfactory results can be achieved in some embodiments without post-irradiation heat treatment. The post-exposure heat treatment seems to anneal the irradiated coating material to increase its condensation without significantly condensing the un-irradiated regions of coating material based on thermal breaking of the organic ligand-metal bonds. For embodiments in which a post irradiation heat treatment is used, the post-irradiation heat treatment can be performed at temperatures from about 45° C. to about 250° C., in additional embodiments from about 50° C. to about 190° C. and in further embodiments from about 60° C. to about 175° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of post-irradiation heating temperature and times within the explicit ranges above are contemplated and are within the present disclosure. This high contrast in material properties further facilitates the formation of sharp lines in the pattern following development as described in the following section.

Following exposure with radiation, the coating material is patterned with irradiated regions and un-irradiated regions. Referring to FIGS. 1 and 2, a patterned structure 100 is shown comprising a substrate 102, a thin film 103 and patterned coating material 104. Patterned coating material 104 comprises regions 110, 112, 114, 116 of irradiated coating material and uncondensed regions 118, 120, 122 of un-irradiated coating material. The pattern formed by condensed regions 110, 112, 114, 116 and uncondensed regions 118, 120, 122 represent a latent image into the coating material, and the development of the latent image is discussed in the following section.

Development and Patterned Structure

Development of the image involves the contact of the patterned coating material including the latent image to a developer composition to remove either the un-irradiated coating material to form the negative image or the irradiated coating to form the positive image. Using the resist materials described herein, effective negative patterning or positive patterning can be performed with desirable resolution using appropriate developing solutions, generally based on the same coating. In particular, the irradiated regions are at least partially condensed to increase the metal oxide character so that the irradiated material is resistant to dissolving by organic solvents while the un-irradiated compositions remain soluble in the organic solvents. Reference to a condensed coating material refers to at least partial condensation in the sense of increasing the oxide character of the material relative to an initial material. On the other hand, the un-irradiated material is less soluble in weak aqueous bases or acids due to the hydrophobic nature of the material so that aqueous bases can be used to remove the irradiated material while maintaining the non-irradiated material for positive patterning.

The coating compositions with organic-stabilization ligands produce a material that is inherently relatively hydrophobic. Irradiation to break at least some of the organic metal bonds converts the material into a less hydrophobic, i.e., more hydrophilic, material. This change in character provides for a significant contrast between the irradiated coating and non-irradiated coating that provides for the ability to do both positive tone patterning and negative tone patterning with the same resist composition. Specifically, the irradiated coating material condenses to some degree into a more of a metal oxide composition; however, the degree of condensation generally is moderate without significant heating so that the irradiated material is relatively straightforward to develop with convenient developing agents.

Figure 6:
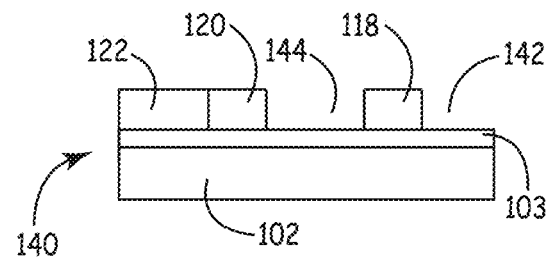
FIG. 6 is a side view of the patterned structure of FIG. 5.

With respect to negative tone imaging, referring to FIGS. 3 and 4, the latent image of the structure shown in FIGS. 1 and 2 has been developed through contact with a developer to form patterned structure 130. After development of the image, substrate 102 is exposed along the top surface through openings 132, 134, 135. Openings 132, 134, 135 are located at the positions of uncondensed regions 118, 120, 122 respectively. With respect to positive tone imaging, referring to FIGS. 5 and 6, the latent image of the structure shown in FIGS. 1 and 2 has been developed to form patterned structure 140. Patterned structure 140 has the conjugate image of patterned structure 130. Patterned structure 140 has substrate 102 exposed at positions of irradiated regions 110, 112, 114, 116 that are developed to form openings 142, 144, 146, 148.

For the negative tone imaging, the developer can be an organic solvent, such as the solvents used to form the precursor solutions. In general, developer selection can be influenced by solubility parameters with respect to the coating material, both irradiated and non-irradiated, as well as developer volatility, flammability, toxicity, viscosity and potential chemical interactions with other process material. In particular, suitable developers include, for example, aromatic compounds (e.g., benzene, xylenes, toluene), esters (e.g., propylene glycol monomethyl ester acetate, ethyl acetate, ethyl lactate, n-butyl acetate, butyrolactone), alcohols (e.g., 4-methyl-2-pentanol, 1-butanol, isopropanol, 1-propanol, methanol), ketones (e.g., methyl ethyl ketone, acetone, cyclohexanone, 2-heptanone, 2-octanone), ethers (e.g., tetrahydrofuran, dioxane, anisole) and the like. The development can be performed for about 5 seconds to about 30 minutes, in further embodiments from about 8 seconds to about 15 minutes and in addition embodiments from about 10 seconds to about 10 minutes. A person of ordinary skill in the art will recognize that additional ranges within the explicit ranges above are contemplated and are within the present disclosure.

For positive tone imaging, the developer generally can be aqueous acids or bases. In some embodiments, aqueous bases can be used to obtain sharper images. To reduce contamination from the developer, it can be desirable to use a developer that does not have metal atoms. Thus, quaternary ammonium hydroxide compositions, such as tetraethylammonium hydroxide, tetrapropylammonium hydroxide, tetrabutylammonium hydroxide or combinations thereof, are desirable as developers. In general, the quaternary ammonium hydroxides of particular interest can be represented with the formula $R_4NOH$, where R=a methyl group, an ethyl group, a propyl group, a butyl group, or combinations thereof. The coating materials described herein generally can be developed with the same developer commonly used presently for polymer resists, specifically tetramethyl ammonium hydroxide (TMAH). Commercial TMAH is available at 2.38 weight percent, and this concentration can be used for the processing described herein. Furthermore, mixed quaternary tetraalkyl-ammonium hydroxides can be used. In general, the developer can comprise from about 0.5 to about 30 weight percent, in further embodiments from about 1 to about 25 weight percent and in other embodiments from about 1.25 to about 20 weight percent tetraalkylammonium hydroxide or similar quaternary ammonium hydroxides. A person of ordinary skill in the art will recognize that additional ranges of developer concentrations within the explicit ranges above are contemplated and are within the present disclosure.

In addition to the primary developer composition, the developer can comprise additional compositions to facilitate the development process. Suitable additives include, for example, dissolved salts with cations selected from the group consisting of ammonium, d-block metal cations (hafnium, zirconium, lanthanum, or the like), f-block metal cations (cerium, lutetium or the like), p-block metal cations (aluminum, tin, or the like), alkali metals (lithium, sodium, potassium or the like), and combinations thereof, and with anions selected from the group consisting of fluoride, chloride, bromide, iodide, nitrate, sulfate, phosphate, silicate, borate, peroxide, butoxide, formate, oxalate, ethylenediamine-tetraacetic acid (EDTA), tungstate, molybdate, or the like and combinations thereof. Other potentially useful additives include, for example, molecular chelating agents, such as polyamines, alcohol amines, amino acids, carboxylic acids, or combinations thereof. If the optional additives are present, the developer can comprise no more than about 10 weight percent additive and in further embodiments no more than about 5 weight percent additive. A person of ordinary skill in the art will recognize that additional ranges of additive concentrations within the explicit ranges above are contemplated and are within the present disclosure. The additives can be selected to improve contrast, sensitivity and line width roughness. The additives in the developer can also inhibit formation and precipitation of metal oxide particles.

With a weaker developer, e.g., lower concentration aqueous developer, diluted organic developer or compositions in which the coating has a lower development rate, a higher temperature development process can be used to increase the rate of the process. With a stronger developer, the temperature of the development process can be lower to reduce the rate and/or control the kinetics of the development. In general, the temperature of the development can be adjusted between the appropriate values consistent with the volatility of the solvents. Additionally, developer with dissolved coating material near the developer-coating interface can be dispersed with ultrasonication during development.

The developer can be applied to the patterned coating material using any reasonable approach. For example, the developer can be sprayed onto the patterned coating material. Also, spin coating can be used. For automated processing, a puddle method can be used involving the pouring of the developer onto the coating material in a stationary format. If desired spin rinsing and/or drying can be used to complete the development process. Suitable rinsing solutions include, for example, ultrapure water, methyl alcohol, ethyl alcohol, propyl alcohol and combinations thereof for negative patterning and ultrapure water for positive patterning. After the image is developed, the coating material is disposed on the substrate as a pattern.

After completion of the development step, the coating materials can be heat treated to further condense the material and to further dehydrate, densify, or remove residual developer from the material. This heat treatment can be particularly desirable for embodiments in which the oxide coating material is incorporated into the ultimate device, although it may be desirable to perform the heat treatment for some embodiments in which the coating material is used as a resist and ultimately removed if the stabilization of the coating material is desirable to facilitate further patterning. In particular, the bake of the patterned coating material can be performed under conditions in which the patterned coating material exhibits desired levels of etch selectivity. In some embodiments, the patterned coating material can be heated to a temperature from about 100° C. to about 600° C., in further embodiments from about 175° C. to about 500° C. and in additional embodiments from about 200° C. to about 400° C. The heating can be performed for at least about 1 minute, in other embodiment for about 2 minutes to about 1 hour, in further embodiments from about 2.5 minutes to about 25 minutes. The heating may be performed in air, vacuum, or an inert gas ambient, such as Ar or $N_2$. A person of ordinary skill in the art will recognize that additional ranges of temperatures and time for the heat treatment within the explicit ranges above are contemplated and are within the present disclosure. Likewise, non-thermal treatments, including blanket UV exposure, or exposure to an oxidizing plasma such as 02 may also be employed for similar purposes.

With conventional organic resists, structures are susceptible to pattern collapse if the aspect ratio, height divided by width, of a structure becomes too large. Pattern collapse can be associated with mechanical instability of a high aspect ratio structure such that forces, e.g., surface tension, associated with the processing steps distort the structural elements. Low aspect ratio structures are more stable with respect to potential distorting forces. With the patternable coating materials described herein, due to the ability to process effectively the structures with thinner layers of coating material, improved patterning can be accomplished without the need for high aspect ratio patterned coating material. Thus, very high resolution features have been formed without resorting to high aspect ratio features in the patterned coating material.

The resulting structures can have sharp edges with very low line-width roughness. In particular, in addition to the ability to reduce line-width roughness, the high contrast also allows for the formation of small features and spaces between features as well as the ability to form very well resolved two-dimensional patterns (e.g., sharp corners). Thus, in some embodiments, adjacent linear segments of neighboring structures can have an average pitch (half-pitch) of no more than about 60 nm (30 nm half-pitch), in some embodiments no more than about 50 nm (25 nm half-pitch) and in further embodiments no more than about 34 nm (17 nm half-pitch). Pitch can be evaluated by design and confirmed with scanning electron microscopy (SEM), such as with a top-down image. As used herein, pitch refers to the spatial period, or the center-to-center distances of repeating structural elements, and as generally used in the art a half-pitch is a half of the pitch. Feature dimensions of a pattern can also be described with respect to the average width of the feature, which is generally evaluated away from corners or the like. Also, features can refer to gaps between material elements and/or to material elements. In some embodiments, average widths can be no more than about 25 nm, in further embodiments no more than about 20 nm, and in additional embodiments no more than about 15 nm. Average line-width roughness can be no more than about 5 nm, in some embodiments no more than about 4.5 nm and in further embodiments from about 2.5 nm to about 4 nm. Evaluating line-width roughness is performed by analysis of top-down SEM images to derive a 3σ deviation from the mean line-width. The mean contains both high-frequency and low-frequency roughness, i.e., short correlation lengths and long correlation lengths, respectively. The line-width roughness of organic resists is characterized primarily by long correlation lengths, while the present organometallic coating materials exhibit significantly shorter correlation lengths. In a pattern transfer process, short correlation roughness can be smoothed during the etching process, producing a much higher fidelity pattern. A person of ordinary skill in the art will recognize that additional ranges of pitch, average widths and line-width roughness within the explicit ranges above are contemplated and are within the present disclosure.

Further Processing of Patterned Coating Material

After forming a patterned coating material, the coating material can be further processed to facilitate formation of the selected devices. Furthermore, further material deposition, etching and/or patterning generally can be performed to complete structures. The coating material may or may not ultimately be removed. The quality of the patterned coating material can in any case be carried forward for the formation of improved devices, such as devices with smaller foot prints and the like.

Figure 7:
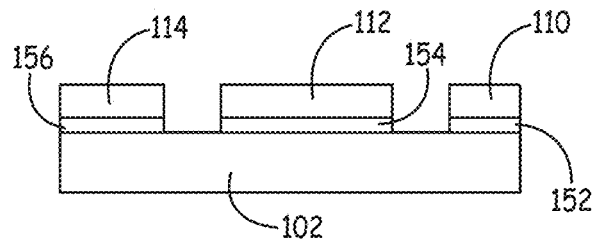
FIG. 7 is a side plan view of the patterned structure of FIGS. 3 and 4 following etching of the underlayer.

The patterned coating material forms openings to the underlying substrate, as shown for example in FIGS. 3 and 4. As with conventional resists, the patterned coating material forms an etch mask which can be used to transfer the pattern to selectively remove an underlying thin film. Referring to FIG. 7, underlying thin film 103 (see FIG. 6) is patterned leaving features 152, 154, 156 respectively under condensed regions 110, 112, 114. Compared with conventional polymer resists, the materials described herein can provide significantly greater etch resistance. Similar processing can be undertaken with the mask pattern shown in FIGS. 5 and 6 with corresponding shifting of the patterned structures that follow directly from the alternative mask pattern.

Alternatively or additionally, the deposition of a further material according to the mask pattern can alter the properties of the underlying structure and/or provide contact to the underlying structure. The further coating material can be selected based on the desired properties of the material. In addition, ions can be selectively implanted into the underlying structure through openings in the mask, as the density of the patterned inorganic coating material can provide a high implant resistance. In some embodiments, the further deposited material can be a dielectric, a semiconductor, a conductor or other suitable material. The further deposited material can be deposited using suitable approaches, such as solution based approaches, chemical vapor deposition (CVD), sputtering, physical vapor deposition (PVD), or other suitable approach.

In general, a plurality of additional layers can be deposited. In conjunction with the deposition of a plurality of layers, additional patterning can be performed. Any additional patterning, if performed, can be performed with additional quantities of the coating materials described herein, with polymer-based resists, with other patterning approaches or a combination thereof.

As noted above, a layer of coating (resist) material following patterning may or may not be removed. If the layer is not removed, the patterned coating (resist) material is incorporated into the structure. For embodiments in which the patterned coating (resist) material is incorporated into the structure, the properties of the coating (resist) material can be selected to provide for desired patterning properties as well as also for the properties of the material within the structure.

Figure 8:
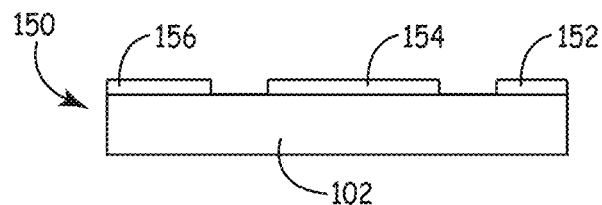
FIG. 8 is a side plan view of the structure of FIG. 7 following etching to remove the patterned, condensed coating material.

If it is desired to remove the patterned coating material, the coating material functions as a conventional resist. The patterned coating material is used to pattern a subsequently deposited material prior to the removal of the resist/coating material and/or to selectively etch the substrate through the spaces in the condensed coating material. The condensed coating material can be removed using a suitable etching process. Specifically, to remove the condensed coating material, a dry etch can be performed, for example, with a $BCl_3$ plasma, $Cl_2$ plasma, HBr plasma, Ar plasma or plasmas with other appropriate process gases. Alternatively or additionally, a wet etch with, for example, an aqueous acid or base, such as HF(aq), or buffered HF(aq)/$NH_4F$ or oxalic acid can be used to remove the patterned coating material. Referring to FIG. 8, the structure of FIG. 8 is shown after removal of the coating material. Etched structure 150 comprises substrate 102 and features 152, 154, 156.

Figure 9:
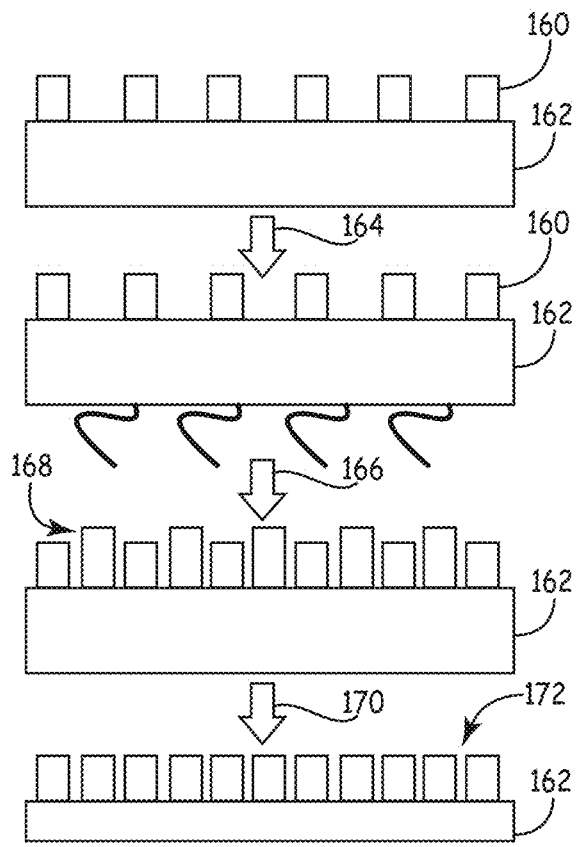
FIG. 9 is a side plan view of a "thermal freeze" double patterning process flow. The process shown in FIGS. 1-3 is repeated after a bake that renders the first layer insoluble to the second layer.

The metal oxo/hydroxo based coating materials are particularly convenient for performing multiple patterning using a thermal freeze process, as described generally with conventional resists in P. Zimmerman, J. Photopolym. Sci. Technol., Vol. 22, No. 5, 2009, p. 625. A double patterning process with a "thermal freeze" is outlined in FIG. 9. In the first step, the coating material is formed into a pattern 160 on substrate 162 using a lithographic process and development as described with respect to FIGS. 3 and 4. A heating step 164 is performed to remove solvent and condense the coating material, which may or may not involve full oxide formation. This heating step is equivalent to the post-development heating step described in the Development section above. This "thermal freeze" process makes the coating material insoluble to a subsequent deposition of a second layer of the coating material. A second lithographic and development step 166 is performed to form a double patterned structure 168 on substrate 162. After an etch step 170, the product double patterned structure 172 is formed. Note that it is straightforward to extend this process to multiple coat and pattern steps, and such extensions are contemplated and are within the present disclosure. With respect to multiple patterning, a significant difference between the inorganic coating materials described herein and conventional organic resists is that organic resists remain soluble in conventional resist casting solvents even after a thermal bake. The resist materials described herein can be condensed with a thermal bake such that they are not soluble in organic solvents and subsequent coating layers can be applied.

EXAMPLES

Example 1—Hydrolysate of t-BuSn(NEt$_2$)$_3$

This example describes the preparation of a hydrolysate precursor solution from t-butyl tris(diethylamido)tin.

A hydrolysate oxide hydroxide product with the nominal formula t-BuSnO$_{(3/2-x/2)}$(OH)$_x$, (where 0>x<3) (1) was prepared from t-butyl tris(diethylamido)tin (2), which was synthesized according to the method reported in Hanssgen, D.; Puff, H.; Beckerman, N. *Journal of Organometallic Chemistry*, 293, 1985, 191-195, which is incorporated herein by reference. A gas-tight syringe was used to steadily (~125 μL/s) add 4.4 g of t-butyl tris(diethylamido) tin to 150 mL of DI H$_2$O (18 MΩ), forming an immediate precipitate that was allowed to stand for 5 minutes. The resulting slurry was stirred for 30 minutes and then suction filtered through no. 1 filter paper (Whatman). The resulting solid was rinsed 3 times with 50-mL portions of DI H$_2$O. Solids retained after filtration and rinsing were dried under vacuum (~5 torr) for 8 h at room temperature to yield 1.9 g of powdered solid of hydrolysate 1.

Figure 10:
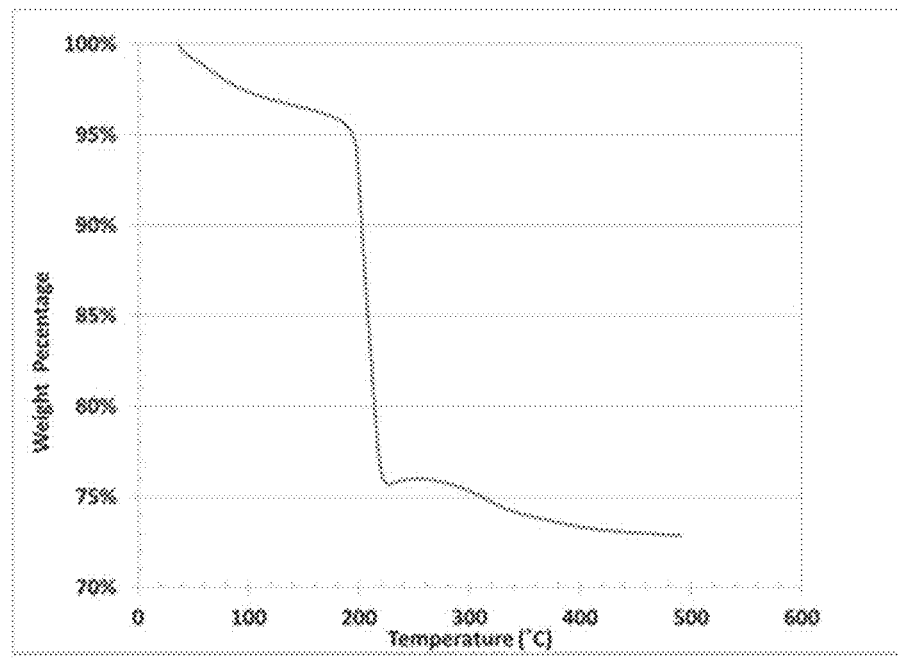
FIG. 10 is a plot of weight loss as a function of temperature in a thermogravimetric analysis.
Figure 11:
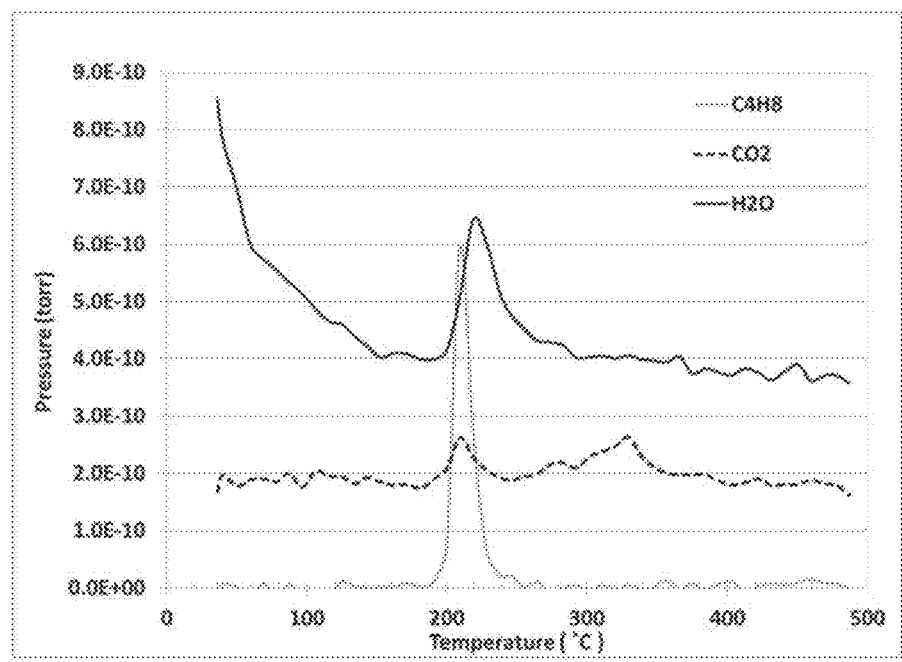
FIG. 11 is a plot of mass spectral analysis as a function of sample temperature performed in combination with the thermogravimetric analysis of FIG. 10.

Elemental analyses of the powder sample by Microanalysis, Inc., Wilmington, Del. yielded 22.43% C, 4.79% H, and 0.11% N (mass). These results are consistent with a composition ratio of 1 t-butyl:1 Sn (expected: 23.01% C, 4.83% H, 0.0% N). The N content indicates complete removal of diethylamine upon hydrolysis of t-butyl tris(diethylamido) tin. Thermogravimetric-Mass Spectrometry analyses, which are performed in dry air on powders prepared by the same procedure, are likewise consistent with an approximate empirical formulation (C$_4$H$_9$)SnOOH for hydrolysate as shown in FIGS. 10 and 11. Stepwise dehydration (50-150° C., ~96% residual weight) and dealkylkation/combustion (200-500° C., ~73%) are observed with a final residual weight corresponding to the expected SnO$_2$ product.

Example 2—Hydrolysate of i-PrSnCl$_3$

This example describes the preparation of a hydrolysate precursor solution from i-propyltin trichloride.

The hydrolysate oxide hydroxide product (i-PrSnO$_{(3/2-x/2)}$(OH)$_x$, where 0<x<3) (3) of i-propyltin trichloride (4, i-PrSnCl$_3$, Gelest) was prepared by rapidly adding 6.5 g of compound i-propyltin trichloride to 150 mL of 0.5-M NaOH (aq) with vigorous stirring, immediately producing a precipitate. The resulting mixture was stirred for 1 h at room temperature and then filtered with suction through no. 1 filter paper (Whatman). The retained solids were washed three times with ~25-mL portions of DI H$_2$O and then dried for 12 h under vacuum (~5 torr) at room temperature.

Elemental analysis (18.04% C, 3.76% H, 1.38% Cl; Microanalysis, Inc.; Wilmington, Del.) of the dried powder, hydrolysate of i-propyltin trichloride, indicated substantial removal of chloride ions occurs upon hydrolysis of i-propyltin trichloride and an approximate hydrolysate empirical formula of i-PrSnO$_{(3/2-x/2)}$(OH)$_x$ where x≈1. (Calculated for C$_3$H$_8$O$_2$Sn: 18.50% C, 4.14% H, 0.00% Cl). The results are consistent with the approximate empirical formula (C$_3$H$_7$) SnOOH for hydrolysate of i-propyltin trichloride.

Example 3—Preparation of Photoresist Solutions

This example describes the preparation of photoresist solutions from the hydrolysate precursors.

Figure 12:
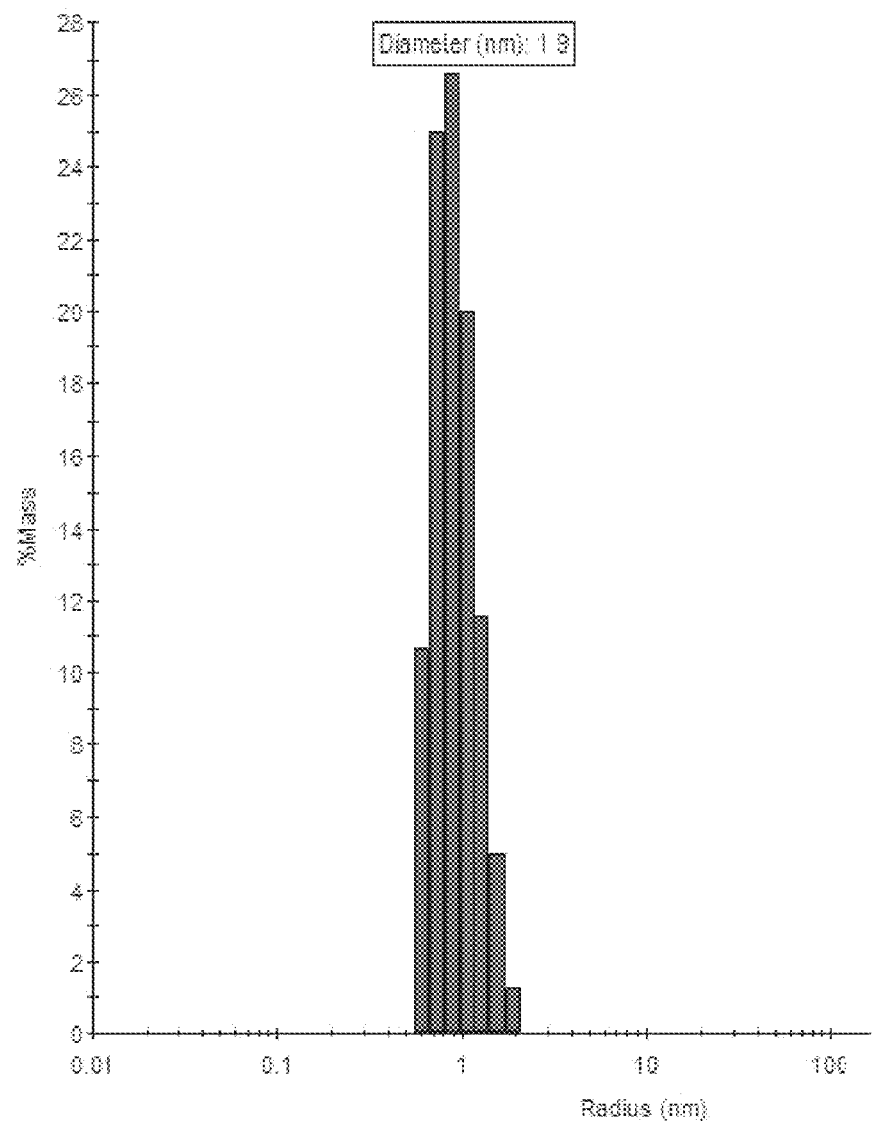
FIG. 12 is histogram showing a particle size distribution obtained from a dynamic light scattering analysis.
Figure 13:
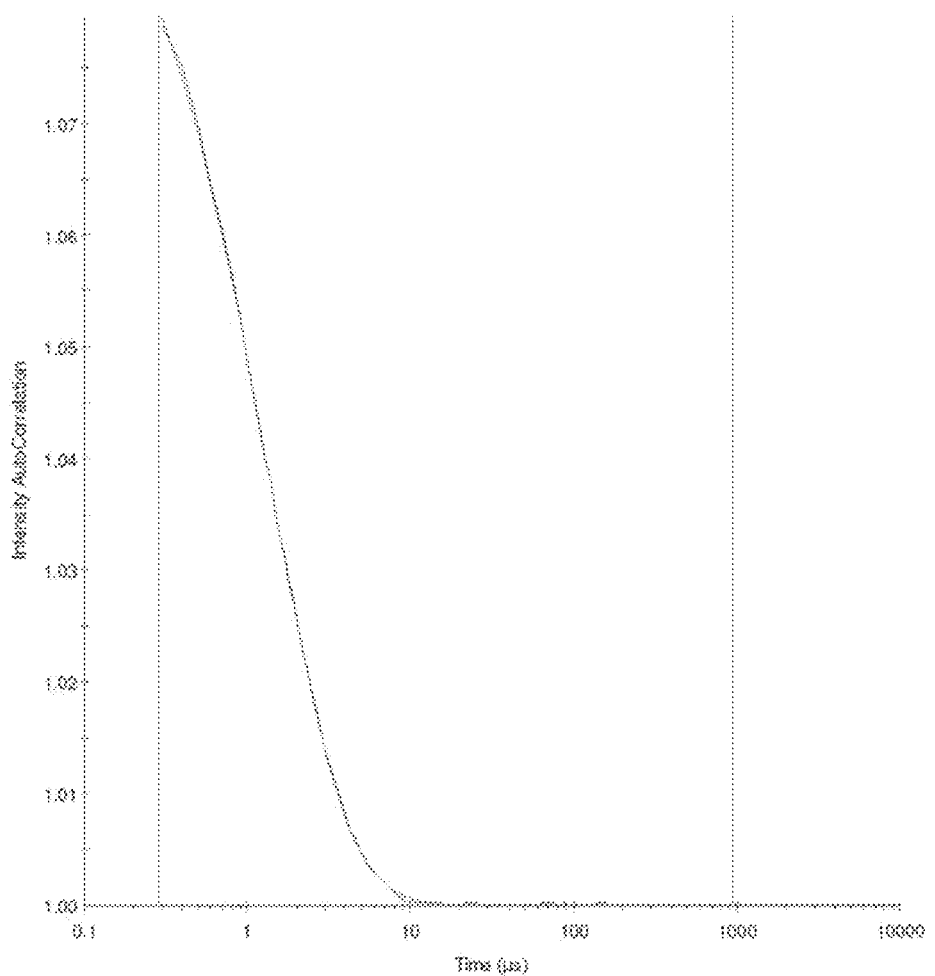
FIG. 13 is a plot of a representative time correlation function from the dynamic light scattering measurement used to obtain particle size distributions such as that of FIG. 12.

A solution of compound 1 (Example 1) was prepared by adding 0.1 g of dry powder to 10 mL of methanol (ACS, 99.8%) while stirring to form a mixture with a Sn concentration of ~0.05 M. After stirring for 24 h, the mixture was filtered through a 0.45-μm PTFE syringe filter to remove insoluble material. Dynamic light scattering (DLS) analysis of the resulting precursor solution, performed using a Möbius instrument (Wyatt Technology), is consistent with a unimodal mass weighted distribution of clusters with a mean diameter of ~1.9 nm, as shown in FIG. 12. A representative time correlation function providing such a particle size distribution is shown in FIG. 13.

Figure 14:
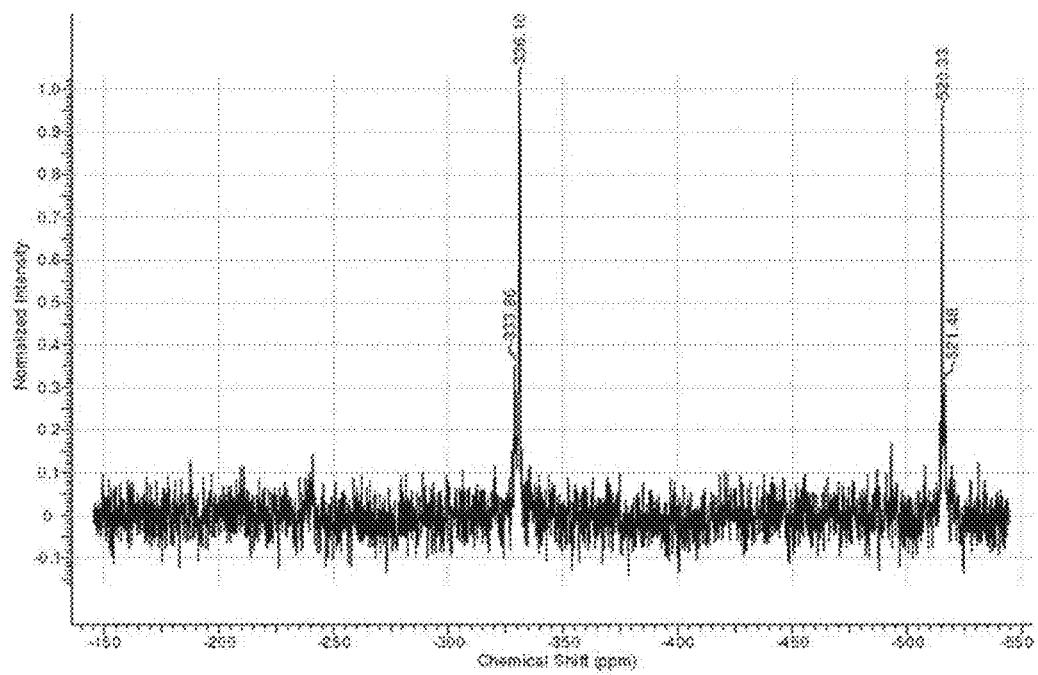
FIG. 14 is a representative $^{119}$Sn NMR spectrum of a solution of compound 1 as described in Example 3.
Figure 15:
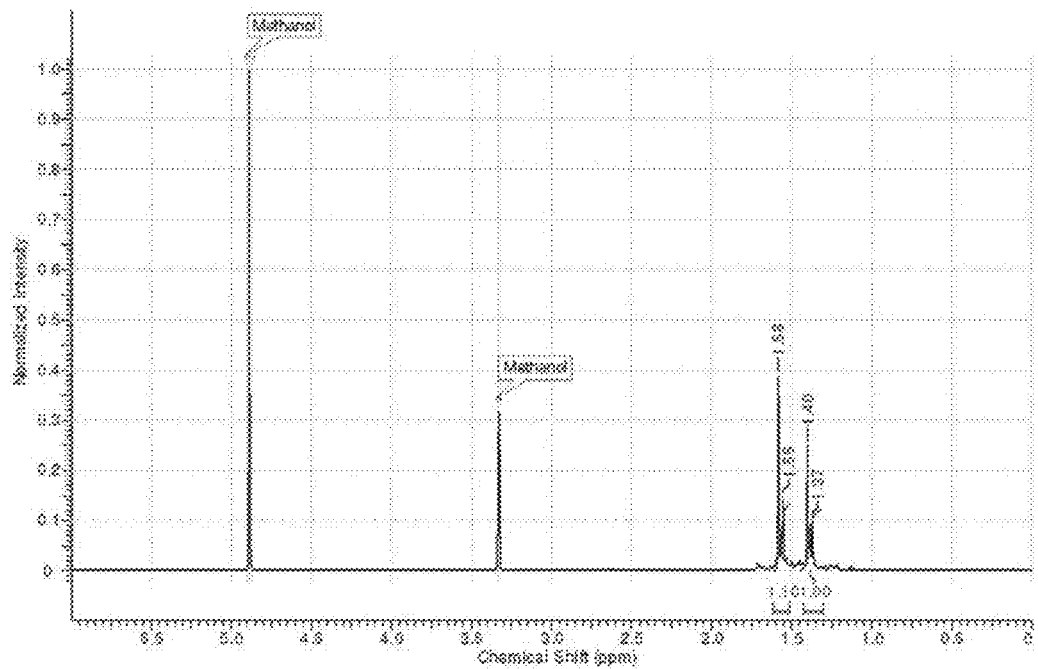
FIG. 15 is a representative $^1$H NMR spectrum of a solution of compound 1 as described in Example 3.

Nuclear Magnetic Resonance (NMR) spectroscopy was performed on similar solutions prepared in d$_4$-methanol using a Bruker Avance-III-HD 600 MHz Spectrometer equipped with a Bruker Prodigy™ CryoProbe. A representative $^{119}$Sn spectrum is shown in FIG. 14, and a representative $^1$H spectrum is shown in FIG. 15. Two primary sets of proton resonances are observed, each consisting of a stronger (1.58, 140 ppm) and weaker (1.55, 1.37 ppm) resonance. These locations and integrated intensities are approximately consistent with the expected chemical shift of the methyl protons on —C(CH$_3$)$_3$ ligands bound to five- and six-coordinate tin atoms in a closo-type dodecameric cluster [(t-BuSn)$_{12}$O$_{14}$(OH)$_6$]$^{+2}$ or closely related chemical environment. Resonances centered at 3.33, and 4.90 ppm are attributed to methanol CH$_3$ and OH protons. Two sets of closely-spaced $^{119}$Sn resonances are observed at −333.86 and −336.10 ppm, and at −520.33 and −521.48 ppm. These results similarly approximate expected shifts for the two tin environments in the cationic dodecamer clusters, as described for (n-BuSn)$_{12}$ clusters by Eychenne-Baron, et al., *Organometallics* 19, 2000, 1940-1949., incorporated herein by reference.

Figure 16:
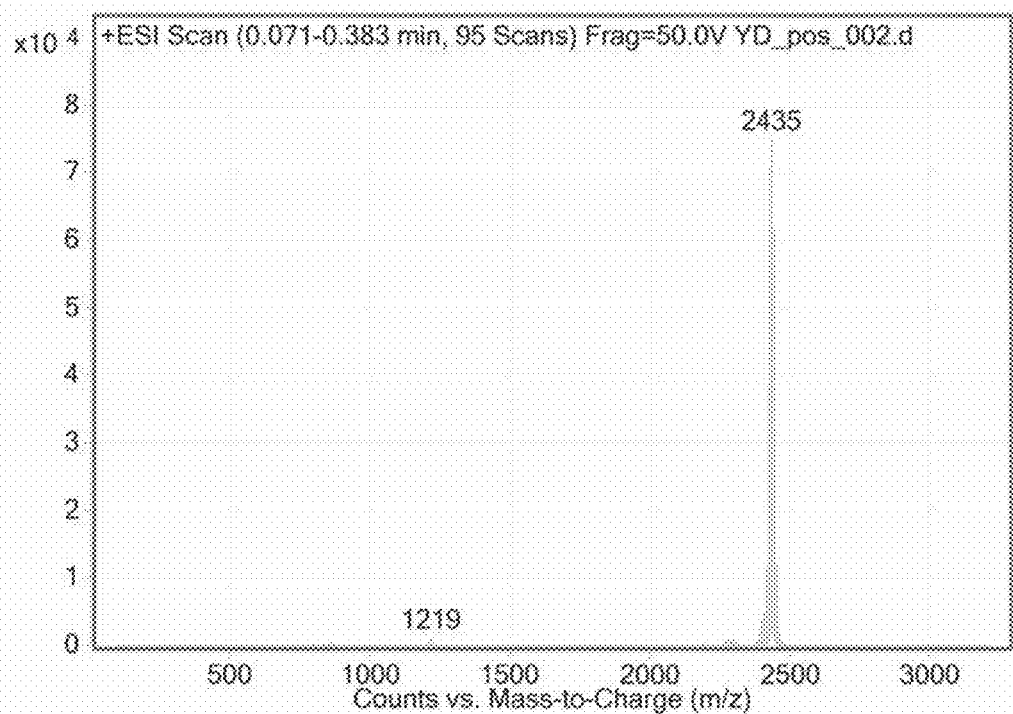
FIG. 16 is a plot of intensity as a function of mass-to-charge ratio of a electrospray mass spectrometry experiment on compound 1 as described in Example 3.

Electrospray Ionization Mass Spectroscopy (ESI-MS) was used to characterize methanol solutions of the same hydrolysate. Representative positive-ion mode mass spectra are presented in FIG. 16. Two primary cationic species are observed in the spectra. One, at a mass to charge (m/z) ratio of 1219, and a second, stronger signal at m/z=2435. These m/z ratios are attributed to the presence of a doubly charged ([(t-BuSn)$_{12}$O$_{14}$(OH)$_6$]$^{+2}$ calculated m/z=1218) and singly charged (deprotonated, [(t-BuSn)$_{12}$(O$_{15}$(OH)$_5$]$^+$ m/z=2435) cationic dodecameric species in the methanol solutions of the hydrolysate. Surrounding the peak at m/z 2436 are a number of shoulder and satellite peaks, that may represent the presence of methoxo and solvated or hydrated derivatives of the primary dodecameric species, and are presumed to correspond to the closely related $^{119}$Sn and $^1$H resonances observed via NMR.

A solution of compound 3 (Example 2) was prepared by adding 0.16 g of dry powder to 10 mL of 4-methyl-2-pentanol (Alfa-Aesar, 99%) while stirring to form a mixture with a Sn concentration of ~0.08 M. After stirring for 2 h, the mixture was dried overnight with activated 4 Å molecular sieves to remove residual water, and then filtered through a 0.45 μm PTFE syringe filter to remove insoluble material.

Example 4—Resist Coating, Film Processing, Negative Tone Imaging

This example demonstrates the formation of a resist pattern based on negative tone imaging with extreme ultraviolet radiation exposure. Branched alkyltin oxide hydroxide photoresists were coated on silicon wafers and negative-tone characteristic contrast curves generated using EUV radiation.

Silicon wafers (100-mm diameter) with a native-oxide surface were used as substrates for thin-film deposition. Si substrates were treated with a hexamethyldisilazane (HMDS) vapor prime prior to resist deposition. Silicon wafers (100-mm diameter) with a native-oxide surface were used as substrates for thin-film deposition. Si substrates were treated with a hexamethyldisilazane (HMDS) vapor prime prior to resist deposition. i-Propyl and t-butyl tin oxide hydroxide photoresist solutions were prepared as described in Example 3, and diluted to ~0.06 and 0.05 M, respectively. Precursor solutions of an n-butyltin oxide hydroxide (n-BuSnO$_{(3/2-x/2)}$(OH)$_x$) resist solutions (0.057 M Sn) were prepared as described in the '524 application cited above. Precursor solutions were spin-coated on Si substrates and baked for 2 minutes at the indicated rpm/temperature to form alkyltin oxide hydroxide resist thin films: 1500 rpm/ 80° C. ($^i$Pr—); 1800 rpm/100° C. ($^n$Bu—); 2000 rpm/100° C. ($^t$Bu—).

A linear array of 50 circular pads ~500 um in diameter were projected on the wafer using EUV light (Lawrence Berkeley National Laboratory Micro Exposure Tool, MET). Pad exposure times were modulated to deliver an increasing EUV dose (7% exponential step) to each pad. Resist and substrate were then subjected to a post-exposure bake (PEB) on a hotplate for 2 min at 100-200° C. The exposed films were dipped in 2-heptanone for 15 seconds and rinsed an additional 15 seconds with the same developer to form a negative tone image, i.e., unexposed portions of the coating were removed. n-Butyltin oxide hydroxide resist films were further rinsed 30s in DI H$_2$O. A final 150° C., 2 minutes hotplate bake was performed to complete the process. Residual resist thicknesses of the exposed pads were measured using a J. A. Woollam M-2000 Spectroscopic Ellipsometer. The measured thicknesses were normalized to the maximum measured resist thickness and plotted versus the logarithm of exposure dose to form characteristic curves for each resist at a series of PEB temperatures. The maximum slope of the normalized thickness vs log dose curve is defined as the photoresist contrast (γ) and the dose value at which a tangent line drawn through this point equals 1 is defined as the photoresist dose-to-gel, (D$_g$). In this way common parameters used for photoresist characterization may be approximated following Mack, C. *Fundamental Principles of Optical Lithography*, John Wiley & Sons, Chichester, U.K; pp 271-272, 2007, incorporated herein by reference.

Figure 17:
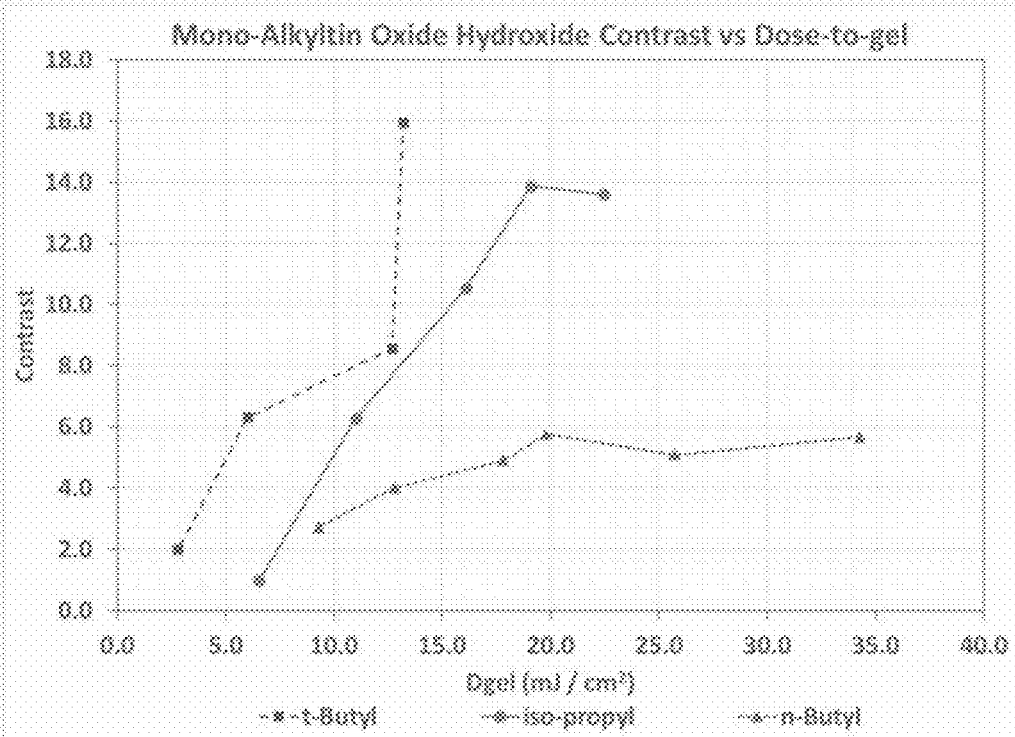
FIG. 17 is a plot of contrast as a function of dose-to-gel for three different coating compositions having distinct alkyl ligands (n-butyl, iso-propyl and t-butyl).

By plotting γ versus D$_g$ for each resist, a clear relationship between decreasing dose and contrast is illustrated as the PEB temperature is increased for each resist (FIG. 17). It is found that both branched alkyltin oxide hydroxide resists tested here have better contrast than the n-butyltin oxide hydroxide-based resist, and preserve equivalent or better contrast at lower dose (as modulated by PEB) when developed in 2-heptanone.

The improved sensitivity and contrast obtained from branched alkyltin oxide hydroxide photoresists were similarly used to generate high-resolution patterns by exposure to EUV radiation. The solution of compound 1 from Example 3 was diluted with methanol to ~0.03 M Sn then spin-coated on the substrate at 2000 rpm and baked on a hotplate for 2 minutes at 100° C. Film thickness following coating and baking was measured via ellipsometry to be ~23 nm.

Figure 18:
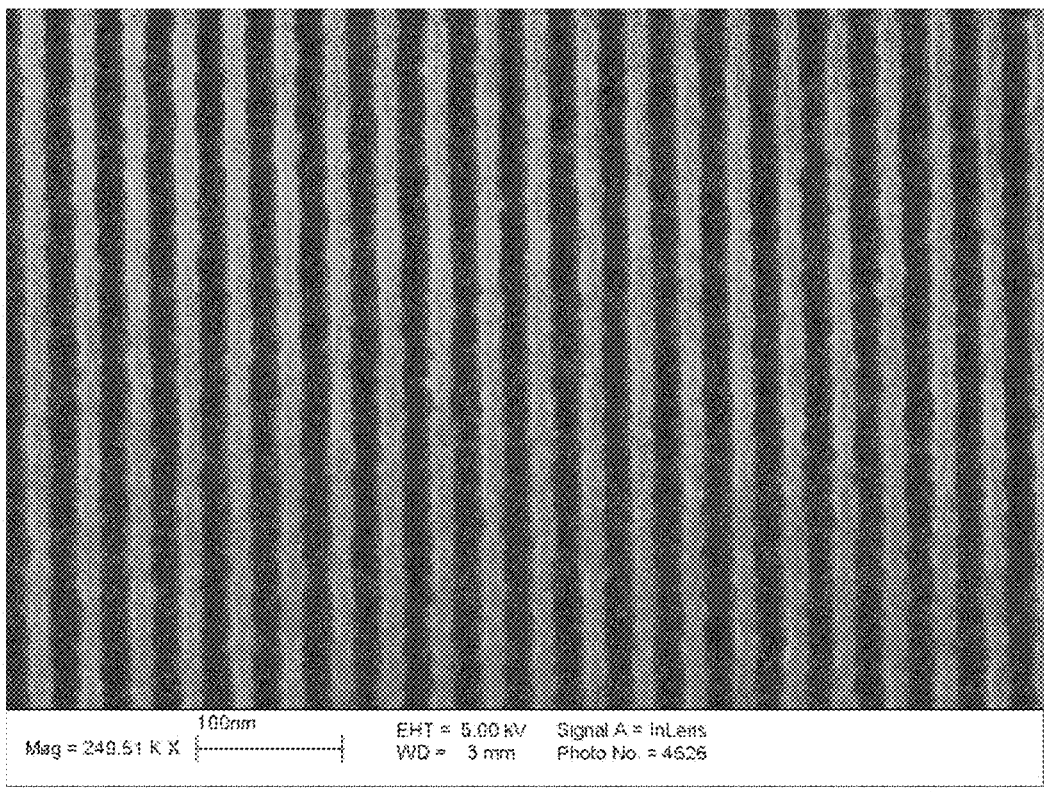
FIG. 18 is a scanning electron micrograph of a silicon wafer patterned with t-butyl tin oxide hydroxide following exposure using 13.5-nm wavelength EUV radiation pattern of 17-nm lines on a 34-nm pitch and following development.

The coated substrate was exposed to extreme ultraviolet radiation (Lawrence Berkeley National Laboratory Micro Exposure Tool). A pattern of 17-nm lines on a 34-nm pitch was projected onto the wafer using 13.5-nm wavelength radiation, dipole illumination, and a numerical aperture of 0.3 at an imaging dose of 43 mJ/cm$^2$. The patterned resist and substrate were then subjected to a post-exposure bake (PEB) on a hotplate for 2 minutes at 175° C. The exposed film was then dipped in 2-heptanone for 15 seconds, rinsed an additional 15 seconds with the same developer, and finally rinsed for 30 seconds with DI H$_2$O to form a negative tone image, i.e., unexposed portions of the coating were removed. A final 5-minute hotplate bake at 150° C. was performed after development. FIG. 18 exhibits SEM images of the resulting 15.4-nm resist lines patterned on a 34-nm pitch with a calculated line-width roughness (LWR) of 4.6 nm.

Figure 19:
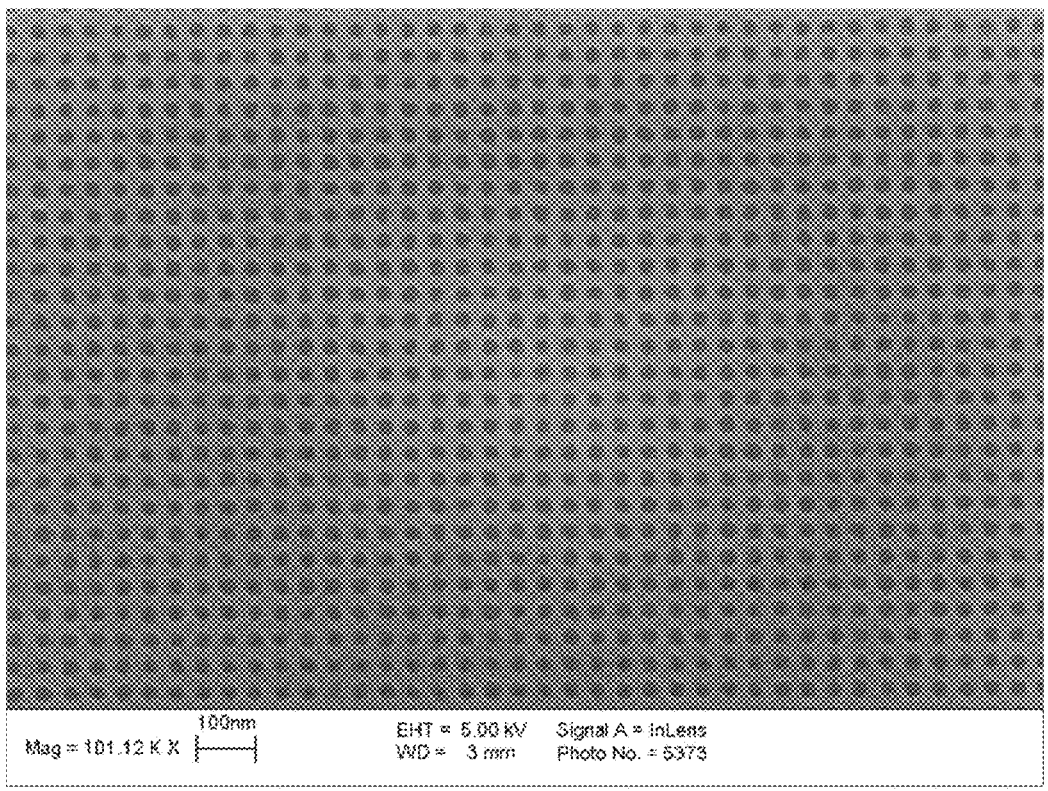
FIG. 19 is a scanning electron micrograph of a silicon wafer patterned with iso-propyl tin oxide hydroxide following exposure using 13.5-nm wavelength EUV radiation in a bright-field pattern of 22-nm contact holes on a 44 nm pitch with a +20% bias and following development.

The solution of i-PrSnO$_{(3/2-x/2)}$(OH)$_x$ (compound 3 from Example 2) was used in a similar way to realize high-resolution patterning via EUV exposure. Solution of 3 from Example 3 was diluted in 4-methyl-2-pentanol to ~0.06 M Sn, and spin-coated on a second Si substrate at 1500 rpm and baked on a hotplate for 2 minutes at 80° C. Film thickness following coating and baking was measured via ellipsometry to be ~19 nm. A bright-field pattern of 22-nm contact holes on a 44 nm pitch with a +20% bias was projected onto the wafer using quadrupole illumination at an imaging dose of 36 mJ/cm$^2$. The patterned resist and substrate were then subjected to a PEB for 2 minutes at 150° C. The exposed film was then dipped in 2-octanone for 15 seconds and rinsed with 2-octanone for an additional 15 seconds to form a negative tone image with unexposed portions of the coating removed, leaving a pattern of contact holes. A final 5-minute hotplate bake at 150° C. was performed after development. FIG. 19 exhibits SEM images of the resulting 22-nm holes patterned on a 44-nm pitch.

Example 5—Preparation of Photoresist Solutions with Mixed Alkyl Ligands

This Example describes the formulation of precursor solutions comprising mixed alkyl ligands, and the effectiveness of these formulations for patterning are described in the following example.

A t-butyltin oxide hydroxide hydrolysate (1) was prepared from t-butyl tris(diethylamido)tin following the method described above in Example 1. A gas-tight syringe was used to add 4.4 g (11 mmol) of t-butyl tris(diethylamido)tin to 150 mL of DI H$_2$O (18 MΩ), forming an immediate precipitate that was allowed to stand for 5 minutes. The resulting slurry was stirred for 30 minutes and then suction filtered through no. 1 filter paper (Whatman) and rinsed 3 times with 60-mL portions of DI H$_2$O. Solids retained after filtration and rinsing were dried under vacuum (~5 torr) for 17 hours at room temperature to yield 1.85 g of powdered solid of hydrolysate t-butyltin oxide hydroxide (1).

An i-propyltin oxide hydroxide hydrolysate (3) was similarly prepared by the method described above in Example 2. A 9.65 g (36 mmol) quantity of i-propyltin trichloride (i-PrSnCl$_3$, Gelest) was rapidly added to 220 mL of 0.5-M NaOH (aq) while stirring vigorously, immediately producing a precipitate. The resulting mixture was stirred for 1.25 hours at room temperature and then filtered with suction through two no. 5 filter papers (Whatman). The retained solids were washed 3 times with ~30-mL portions of DI H$_2$O and then dried for 16 hours under vacuum (~5 torr) at room temperature.

Separate solutions of t-butyltin oxide hydroxide hydrolysate (1) and i-propyltin oxide hydroxide hydrolysate (3) were prepared from the respective powders. A 1.04 g quantity of dried powder t-butyltin oxide hydroxide hydrolysate was added to 100 mL methanol (ACS, 99.8%) and stirred for 24 hours, whereupon the mixture was syringe filtered through a 0.45-um PTFE filter to remove insoluble particles. The residual mass of a sample following solvent evaporation and subsequent thermal decomposition of the residual solids at 700° C. in air was consistent with an initial Sn concentration of 0.035 M assuming stoichiometric conversion to SnO$_2$. A solution of i-propyltin oxide hydroxide hydrolysate (3) was prepared by adding 3.129 g of dry powder to 80 mL of 4-methyl-2-pentanol (Alfa-Aesar, 99%) while stirring. After stirring for 6 hours, the mixture was dried 60 hours over activated 4 Å molecular sieves, then vacuum filtered through a 0.2-um PTFE membrane filter to remove insoluble material. The Sn concentration of the solution was found to be 0.16 M via thermal decomposition to the oxide.

Photoresist formulations A-F (Table 2) were prepared by mixing the methanol solution of t-butyl tin oxide hydroxide hydrolysate (1) with the 4-methyl-2-pentanol solution of i-propyl tin oxide hydroxide hydrolysate (3), and diluting the resulting mixture with pure solvents according to the volumes specified in Table 2. The resulting solutions are characterized as a blend of i-PrSnO$_{(3/2-x/2)}$(OH)$_x$ and t-BuSnO$_{(3/2-x/2)}$(OH)$_x$ hydrolysates, where the fraction of t-BuSnO$_{(3/2-x/2)}$(OH)$_x$ is expressed relative to the total Sn concentration.

TABLE 2

| Formulation | Volume Added (mL) | | | | t-Bu—Sn relative to Total Sn (%) |
| --- | --- | --- | --- | --- | --- |
| | Methanol | 4-methyl 2-pentanol | Solution 3 | Solution 1 | |
| A | 0 | 0 | 0 | 5 | 100 |
| B | 0 | 0.75 | 0.5 | 3.75 | 62 |
| C | 0 | 0.45 | 0.8 | 3.75 | 50 |
| D | 1.033 | 0.517 | 1.15 | 2.3 | 30 |
| E | 0 | 1.5 | 1.5 | 2 | 22 |
| F | 0 | 2.75 | 2.25 | 0 | 0 |

Example 6 Resist Coating, Film Processing, Negative Tone Imaging with Mixed Alkyl Ligand Precursors Mixed-ligand organotin oxide hydroxide photoresists were used to generate negative-tone patterns by exposure to extreme ultraviolet radiation. This Example explores patterning using the precursor solutions from Example 5 having mixed alkyl ligands.

Silicon wafers (100-mm diameter) with a native-oxide surface were used as substrates for thin-film deposition. Si substrates were treated with a hexamethyldisilazane (HMDS) vapor prime prior to resist deposition. Resist formulations A-F from Example 5 were spin-coated on substrates at 2000-2500 rpm and baked on a hotplate for 2 minutes at 100° C. Film thickness following coating and baking was measured via ellipsometry to be ~30 nm. The coated substrates were exposed to extreme ultraviolet radiation (Lawrence Berkeley National Laboratory Micro Exposure Tool). A pattern of 17-nm lines and spaces on a 34-nm pitch was projected onto the wafer using 13.5-nm wavelength radiation, dipole illumination, and a numerical aperture of 0.3. The patterned resist and substrate were then subjected to a post-exposure bake (PEB) on a hotplate for 2 minutes at 170° C. The exposed film was then dipped in 2-heptanone for 15 seconds and rinsed an additional 15 seconds with the same developer to form a negative tone image, i.e., unexposed portions of the coating were removed. A final 5-minute hotplate bake at 150° C. was performed after development.

Figure 20:
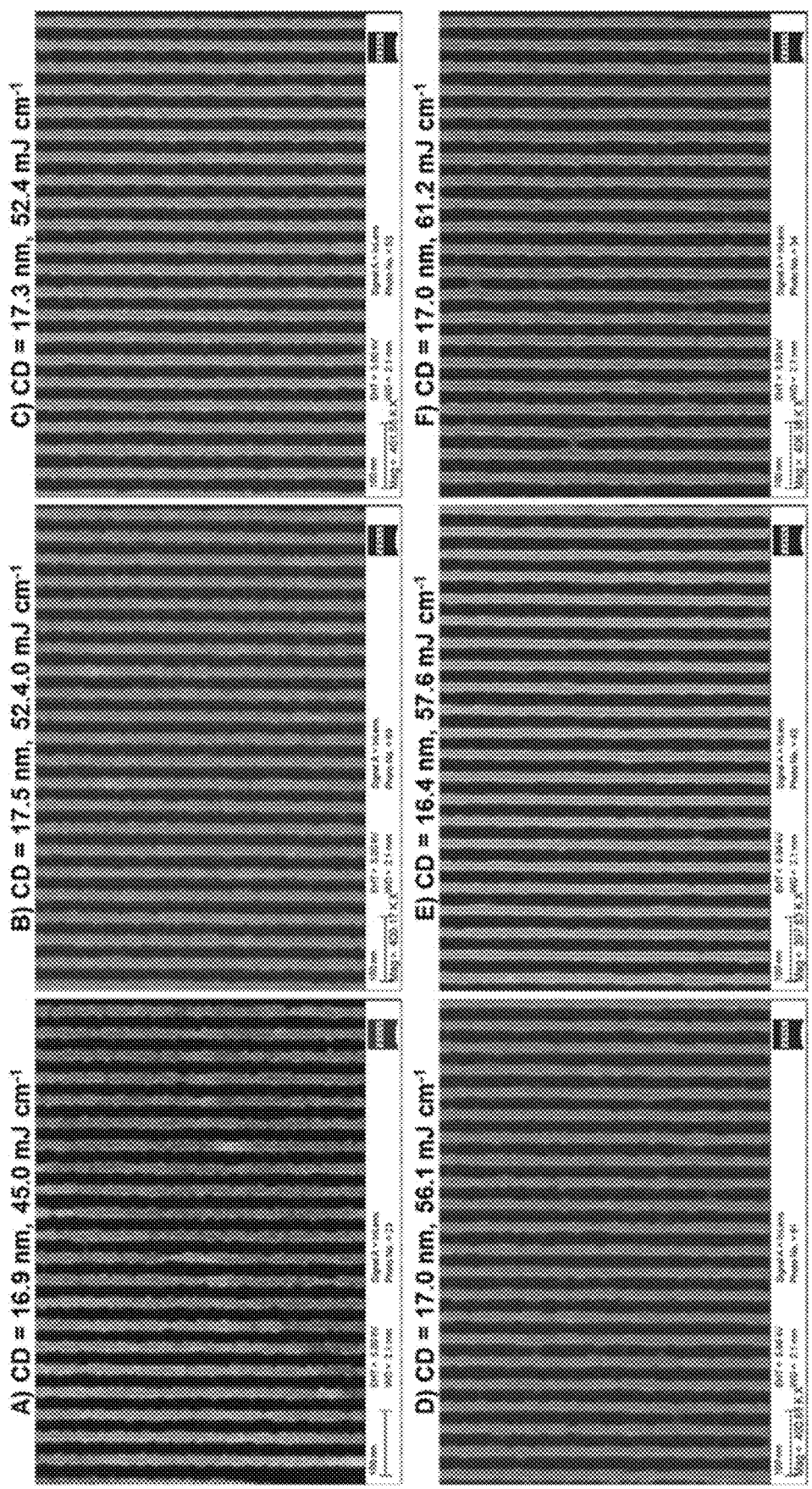
FIG. 20 is a series of SEM micrographs for 6 different formulation with various combinations of iso-propyl tin oxide hydroxide and/or t-butyl tin oxide hydroxide patterned following exposure using 13.5-nm wavelength EUV radiation pattern of 17-nm lines on a 34-nm pitch and following development.
Figure 21:
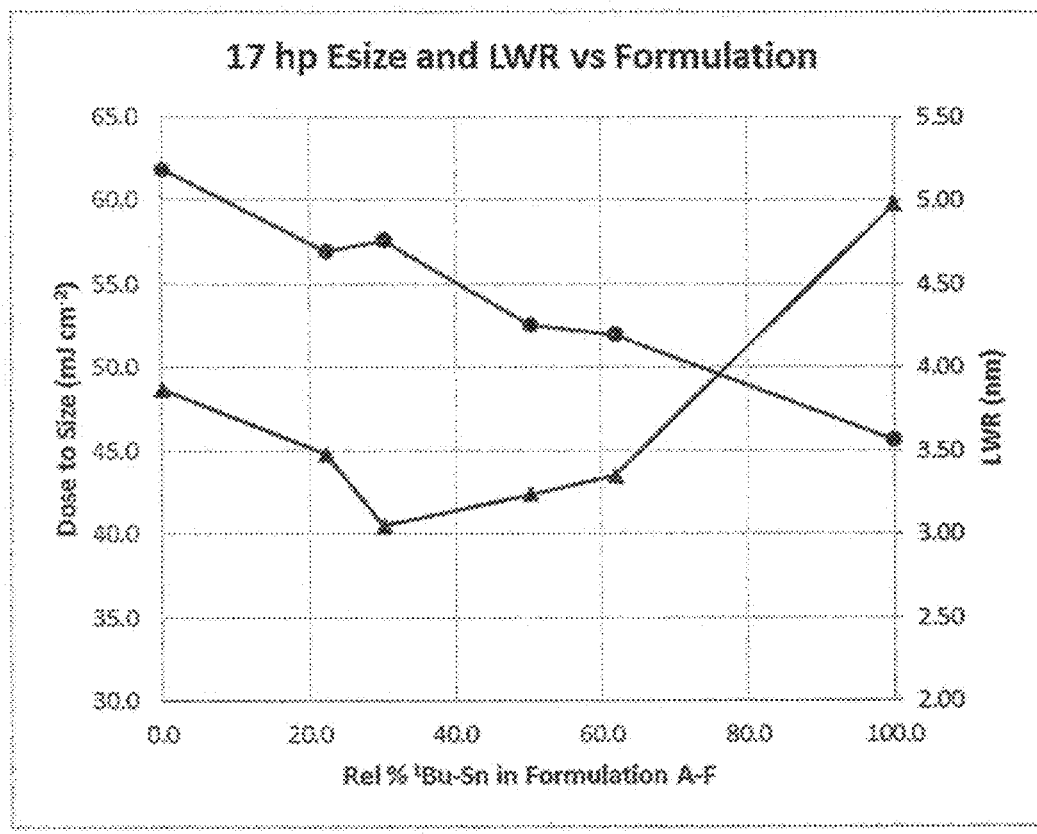
FIG. 21 is a plot of dose-to-size plotted as a function of coating composition for formulations A-F used to obtain the micrographs in FIG. 20.

FIG. 20 exhibits SEM images of the resulting resist lines patterned on a 34-nm pitch. SuMMIT analysis software (EUV Technology Corporation) was used to extract resist critical dimension (CD) and line-width-roughness (LWR) from SEM images of 17 hp lines patterned using resist formulation A-F. A plot of LWR and Dose to size (E$_{size}$) for each formulation is shown in FIG. 21. A clear trend of decreasing dose (circular dots) is observed across the formulations as the fraction of t-BuSnO$_{(3/2-x/2)}$(OH)$_x$ is increased. Moreover, LWR (triangular dots) in FIG. 21 for blended formulations are substantially lower than pure t-BuSnO$_{(3/2-x/2)}$(OH)$_x$ and i-PrSnO$_{(3/2-x/2)}$(OH)$_x$ formulations A and F, respectively.

Example 7—Preparation of an Iso-Propyltin Hydroxide Oxide Hydrolysate Via an Iso-Propyl Tris(Dimethylamido)Tin Precursor A water-reactive precursor, isopropyl tris(dimethylamido)tin, (i-PrSn(NMe$_2$)$_3$), was synthesized under inert atmosphere and subsequently hydrolysed by two methods using 1) atmospheric moisture and 2) liquid H$_2$O, to form an i-PrSnO$_{(3/2-x/2)}$(OH)$_x$ hydrolysate.

Figure 22:
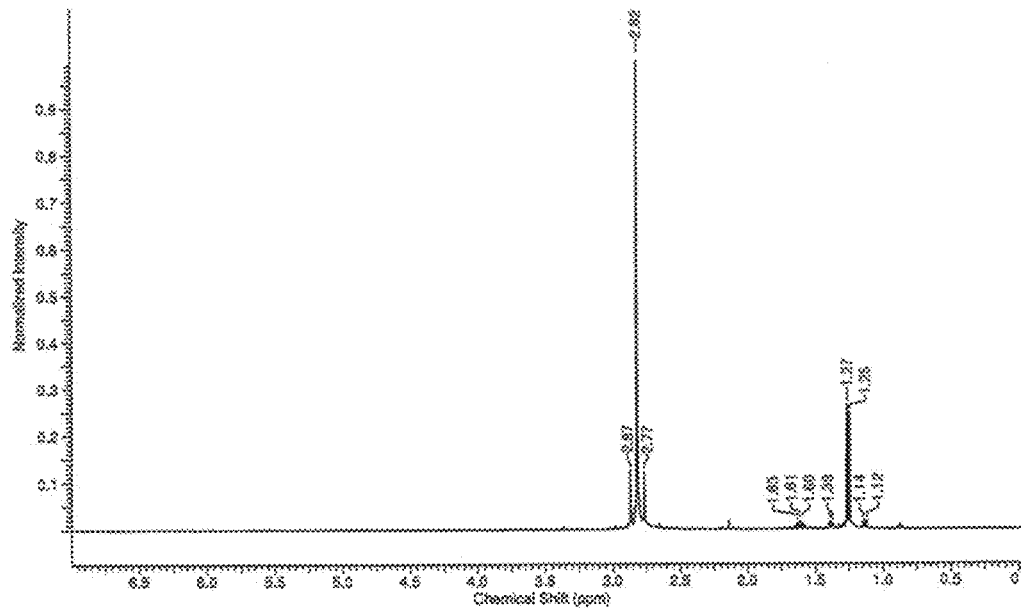
FIG. 22 is a $^1$H NMR spectrum of i-PrSn(NMe$_2$)$_3$ prepared as described in Example 7.
Figure 23:
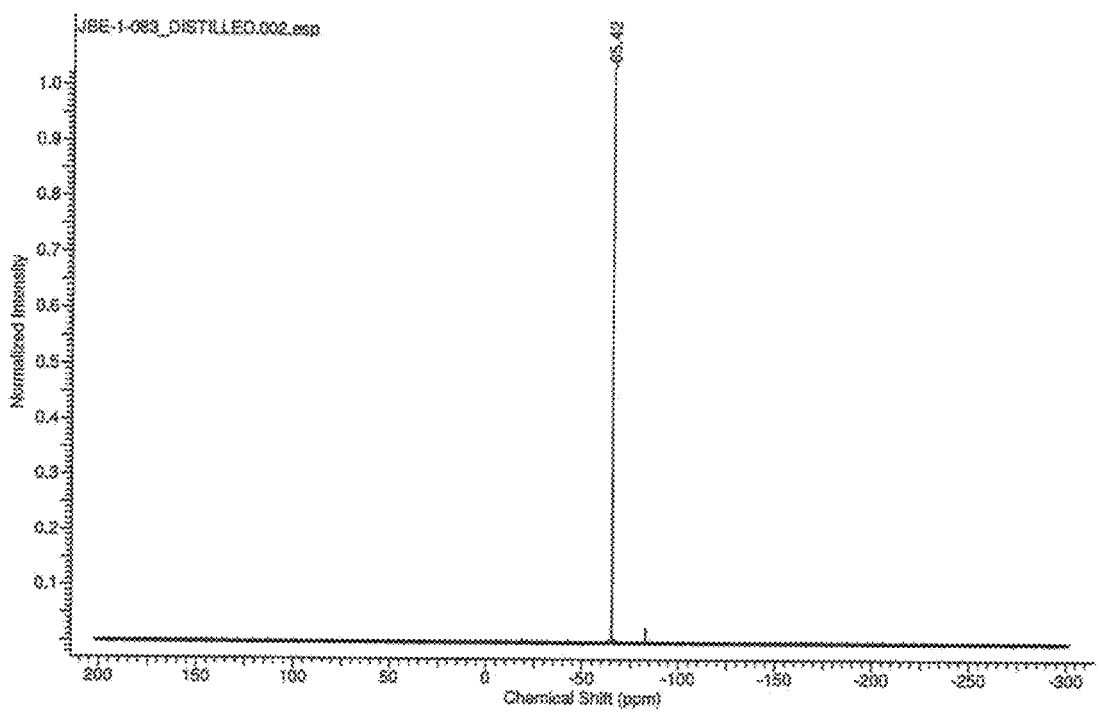
FIG. 23 is a $^{119}$Sn NMR spectrum of i-PrSn(NMe$_2$)$_3$ prepared as described in Example 7.

Under argon, a 1 L Schlenk-adapted round bottom flask was charged with LiNMe$_2$ (81.75 g, 1.6 mol, Sigma-Aldrich) and anhydrous hexanes (700 mL, Sigma-Aldrich) to form a slurry. A large stir bar was added and the vessel sealed. An addition funnel under positive argon pressure was charged with i-PrSnCl$_3$, (134.3 g, 0.5 mol, Gelest) via syringe and attached to the reaction flask. The flask was cooled to −78° C. and the i-PrSnCl$_3$ added dropwise over a period of 2 hours. The reaction was allowed to come to room temperature overnight while stirring, and the solid precipitates allowed to settle. After settling, the reaction solution was filtered under positive argon pressure through an in-line cannula filter. The solvent was removed under vacuum and the residue distilled under reduced pressure (50-52° C., 1.4 mmHg) to give a pale yellow liquid (110 g, 75% yield). $^1$H and $^{119}$Sn NMR spectra of the distillate in a C$_6$D$_6$ solvent collected on a Bruker DPX-400 (400 MHz, BBO probe) spectrometer are shown in FIGS. 22 and 23, respectively. Observed $^1$H resonances, as shown in FIG. 22, (s, 2.82 ppm, —N(CH$_3$)$_2$; d 1.26 ppm, —CH$_3$; m, 1.60 ppm, —CH) match the predicted spectra for $^i$PrSn(NMe$_2$)$_3$. The primary $^{119}$Sn resonance, as shown in FIG. 23, at −65.4 ppm is consistent with a major product with a single tin environment, with a chemical shift comparable to reported monoalkyltin amido compounds.

An i-propyltin oxide hydroxide hydrolysate was prepared from the i-propyl tris(dimethylamido) tin, (i-PrSn(NMe$_2$)$_3$), via H$_2$O hydrolysis using two different methods.

Figure 24:
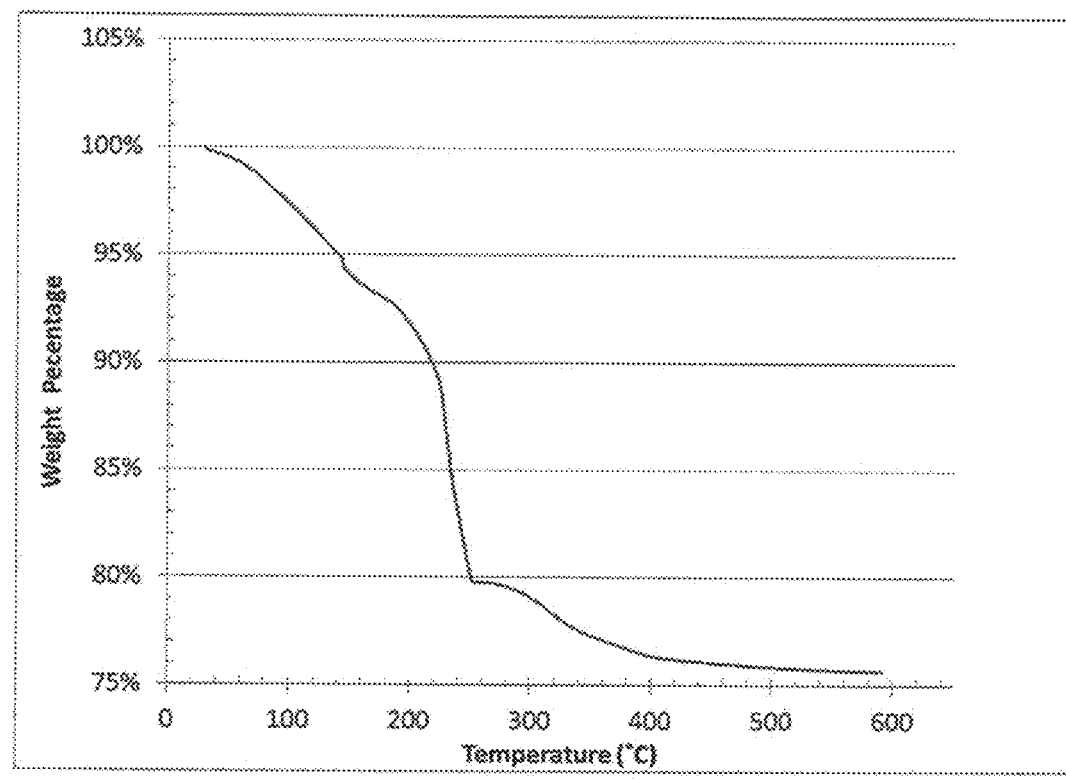
FIG. 24 is plot of weight as a function of temperature in a thermogravimetric analysis of a sample of isopropyl tin oxide hydroxide prepared by Method 1 in Example 7.
Figure 25:
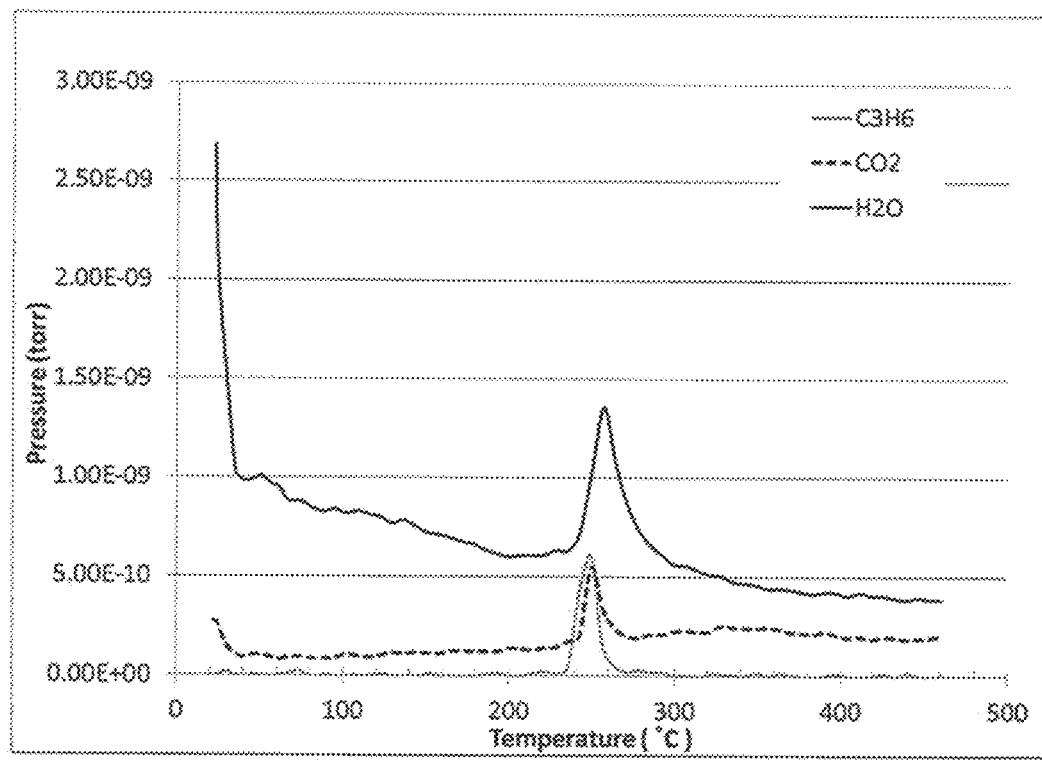
FIG. 25 is a mass spectral analysis performed in conjunction with the thermogravimetric analysis of FIG. 24.

Method 1:

A gas-tight syringe was used to add 23.4 g (79.6 mmol) of i-propyl tris(dimethylamido) tin, (i-PrSn(NMe$_2$)$_3$) to 150 mL of n-hexanes (HPLC Grade, >99.5% Hexanes, >95% n-Hexane), forming an opaque suspension that was stirred for 5 minutes in air, then poured in equal volumes into six 150 mm diameter petri dishes. The suspensions were allowed to react with atmospheric moisture while the solvent evaporated in air for 1.5 hours, leaving a crude solid that was collected, combined, and dried under vacuum for 15 hours to yield 15.8 g of solid hydrolysate (compound 3, Example 2). Elemental analyses (UC Berkeley Microanalytical Facility) of a hydrolysate powder prepared by the same procedure returned a composition of 18.91% C, 4.24% H, and 0.51% N (mass), consistent with substantial hydrolysis of dimethylamido ligands and evaporation of the resultant alkyl amine. The results are consistent with calculated values for C$_3$H$_8$O$_2$Sn: 18.50% C, 4.14% H, 0.00% N, and 60.94% Sn, mass). Thermogravimetric analysis (FIG. 24) of the same sample in dry air is indicative of a Sn composition of ~60% (mass) based on the residual weight at 500° C. (75.9%) assuming complete decomposition to SnO$_2$. The mass spectral analysis of the same decomposition (FIG. 25) indicates the presence of —C$_3$H$_6$. Taken together, these results agree with an empirical composition of i-PrSnSnO$_{(3/2-x/2)}$(OH)$_x$ where x≈1, and the possible presence of a small amount of residual dimethyl amido.

Figure 26:
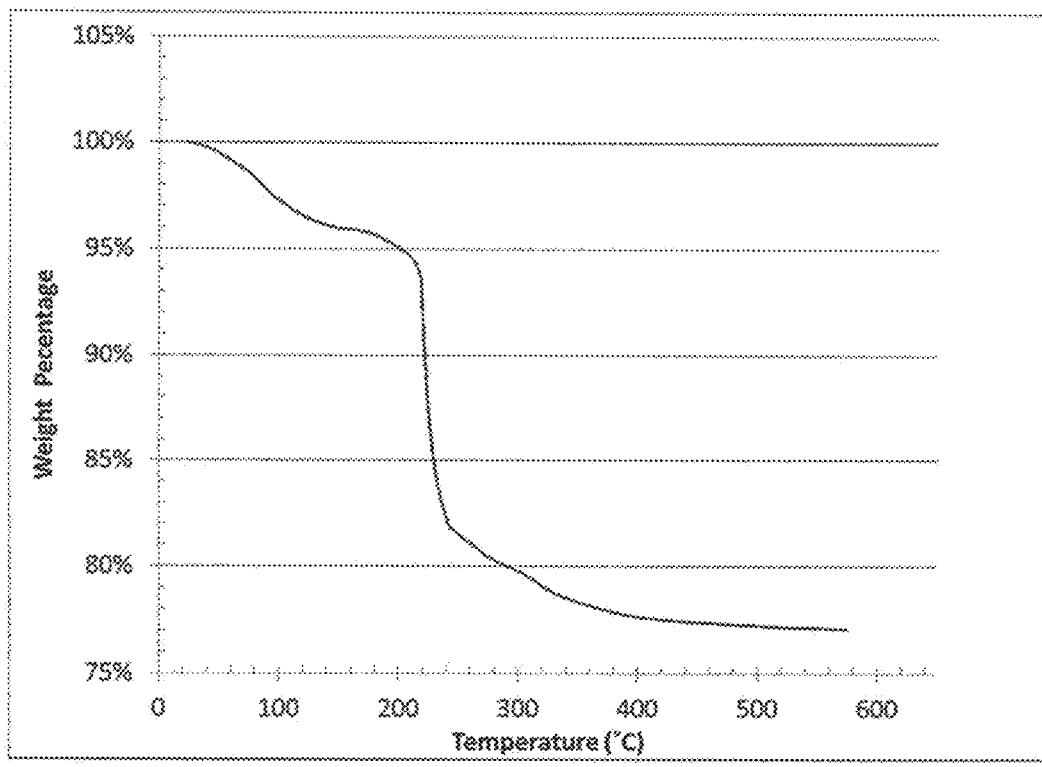
FIG. 26 is plot of weight as a function of temperature in a thermogravimetric analysis of a sample of isopropyl tin oxide hydroxide prepared by Method 2 in Example 7.

Method 2:

A gas-tight syringe was used to rapidly add 1.0 g (3.4 mmol) of i-propyl tris(dimethylamido) tin, (i-PrSn(NMe$_2$)$_3$) directly to 15 mL DI H$_2$O (18.2 MΩ) with vigorous stirring to form a slurry that was stirred for an additional 60 minutes. This slurry was then vacuum filtered through a 0.7-μm filter and the retained solids washed with 10 mL DI H$_2$O. The solid was then collected and dried under vacuum for 16 hours to yield 0.7 g of solid hydrolysate. Thermogravimetric analyses, performed in dry air on hydrolysate powders prepared by the same procedure (FIG. 26), are similarly consistent with the empirical composition of 3 (Example 2), i-PrSnSnO$_{(3/2-x/2)}$(OH)$_x$ where x≈1. Weight losses attributed to stepwise dehydration (50-175° C., ~95.7% residual weight) and dealkylkation/combustion (200-500° C., ~77% residual weight) are observed as expected on the basis of complete decomposition of 3 to SnO2.

Example 8—Trace-Metals Analysis of Organotin Oxide Hydroxide Photoresist Solutions A resist precursor solution was prepared by adding 15.8 g of dried powder, prepared according to Method 1 in the preceding example, to 810 mL 4-methyl-2-pentanol (High Purity Products), and stirring for 24 h. Following stirring, the mixture was suction filtered through a 0.22-μm PTFE filter to remove insoluble material. The residual mass of a sample following solvent evaporation and subsequent calcination of the solid at 700° C. in air was consistent with an initial Sn concentration of 0.072 M assuming stoichiometric conversion to SnO$_2$.

Trace-metal concentrations in the resist precursor solution above were evaluated relative to a hydrolysate prepared using aqueous sodium hydroxide and i-propyltin trichloride. The 0.072-M solution prepared above, was further diluted to 0.042 M (Sn) with 4-methyl-2-pentanol. A second i-propyltin oxide hydroxide precursor solution was prepared by hydrolysis of i-PrSnCl$_3$ with aqueous NaOH as described in Example 2, and diluted to 0.42 M Sn with the same high-purity 4-methyl-2-pentanol. Aliquots of both solutions were analyzed using inductively coupled plasma mass spectroscopy (ICP-MS, Balazs Nanoanalysis, Fremont, Calif.) to determine the concentration of 22 metals with a lower detection limit (LDL) of 10 parts per billion (ng/g). The results of these analyses are presented in Table 3. In both cases the concentration of all analyzed metals except sodium (Na) was <10 ppb. The resist solution (A) containing the hydrolysate prepared with NaOH (aq) was found to contain 34,000 ppb residual sodium, even after three washings with 18 MΩ DI H$_2$O. In contrast, the resist solution (B) prepared from the hydrolysate of i-propyl (tris)dimethylamido tin was found to contain <10 ppb Na, as anticipated by the alkali-free hydrolysis.

Trace metal concentrations in i-PrSnSnO$_{(3/2-x/2)}$(OH)$_x$ photoresist precursor solutions as measured by ICP-MS with an LDL of 10 ppb are shown in Table 3.

TABLE 3

| | Concentration, ppb (ng/g) | |
|---|---|---|
| Metal | Resist Precursor A i-PrSnCl$_3$/ NaOH | Resist Precursor B i-PrSn(NMe$_2$)$_3$/ Air |
| Aluminum (Al) | <10 | <10 |
| Arsenic (As) | <10 | <10 |
| Barium (Ba) | <10 | <10 |
| Cadmium (Cd) | <10 | <10 |
| Calcium (Ca) | <10 | <10 |
| Chromium (Cr) | <10 | <10 |
| Cobalt (Co) | <10 | <10 |
| Copper (Cu) | <10 | <10 |
| Gold (Au) | <10 | <10 |
| Iron (Fe) | <10 | <10 |
| Lithium (Li) | <10 | <10 |
| Magnesium (Mg) | <10 | <10 |
| Manganese (Mn) | <10 | <10 |
| Nickel (Ni) | <10 | <10 |
| Palladium (Pd) | <10 | <10 |
| Potassium (K) | <10 | <10 |
| Silver (Ag) | <10 | <10 |
| Sodium (Na) | 34,000 | <10 |
| Titanium (Ti) | <10 | <10 |
| Tungsten (W) | <10 | <10 |
| Vanadium (V) | <10 | <10 |
| Zinc (Zn) | <10 | <10 |

Figure 27:
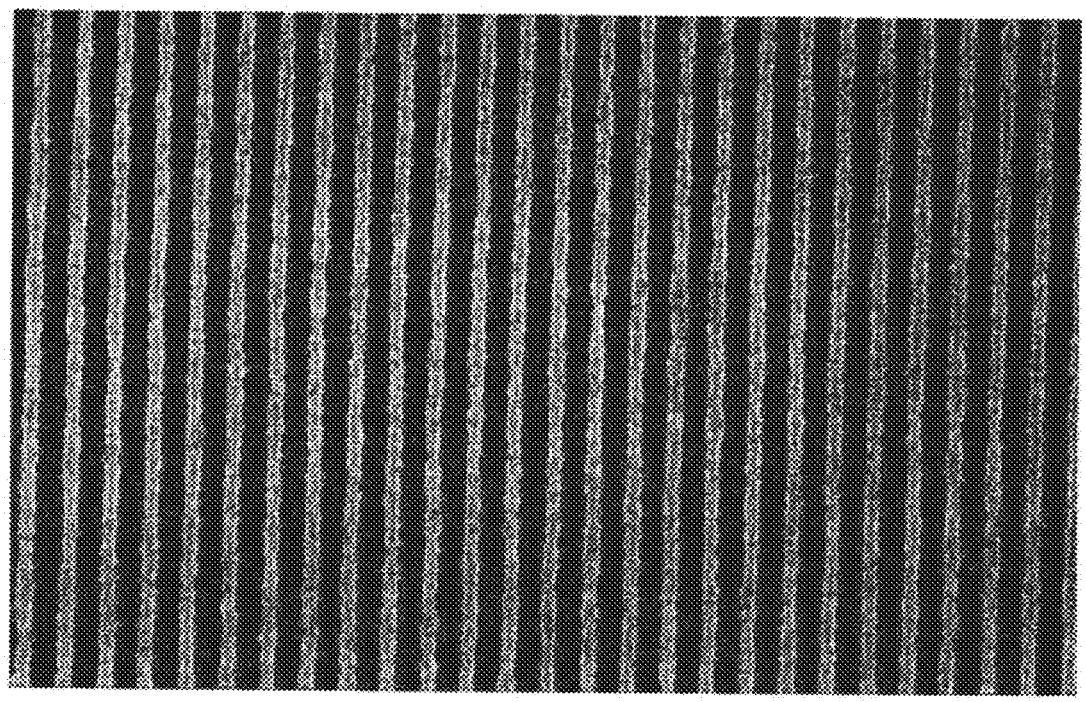
FIG. 27 is an SEM micrograph of a silicon wafer patterned with isopropyl tin oxide hydroxide synthesized using Method 1 of Example 7 following exposure to EUV radiation at an imaging dose of 60 mJ cm$^{-2}$, with resulting 14.5 nm resist lines patterned on a 34 nm pitch with an LWR of 2.9 nm.

Example 9—Film Coating, Processing, and Negative Tone Imaging of a Photoresist with Low Trace-Metal Contamination Silicon wafers (100-mm diameter) with a native-oxide surface were used as substrates for thin-film deposition. Si substrates were treated with a hexamethyldisilazane (HMDS) vapor prime prior to resist deposition. The 0.072 M resist solution from Example 8 was dispensed through a 0.45 nm syringe filter onto a substrate, spin-coated at 1500 rpm, and baked on a hotplate for 2 min at 100° C. Film thickness following coating and baking was measured via ellipsometry to be ~25 nm. The coated substrate was exposed to extreme ultraviolet radiation (Lawrence Berkeley National Laboratory Micro Exposure Tool). A pattern of 17-nm lines and spaces on a 34-nm pitch was projected onto the wafer using 13.5-nm wavelength radiation, dipole illumination, and a numerical aperture of 0.3. The patterned resist and substrate were then subjected to a post-exposure bake (PEB) on a hotplate for 2 min at 180° C. The exposed film was then dipped in 2-heptanone for 15 seconds and rinsed an additional 15 seconds with the same developer to form a negative tone image, i.e., unexposed portions of the coating were removed. A final 5-minute hotplate bake at 150° C. was performed after development. FIG. 27 shows an SEM image of the resulting resist line/space pattern on the substrate defined with an imaging dose of 60 mJ cm², 14.5 nm resist lines patterned on a 34 nm pitch with an LWR of 2.9 nm.

Figure 28:
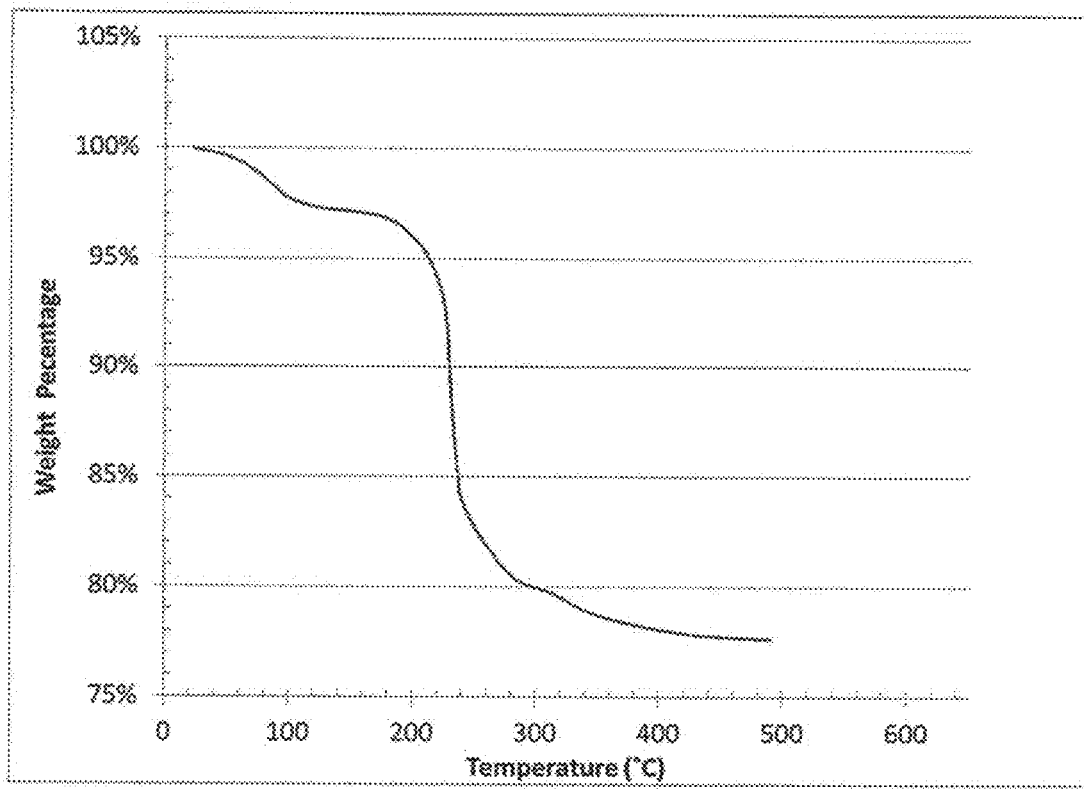
FIG. 28 is a plot of weight as a function of temperature in a thermogravimetric analysis of a sample of isopropyl tin oxide hydroxide formed using the process of Example 10.
Figure 29:
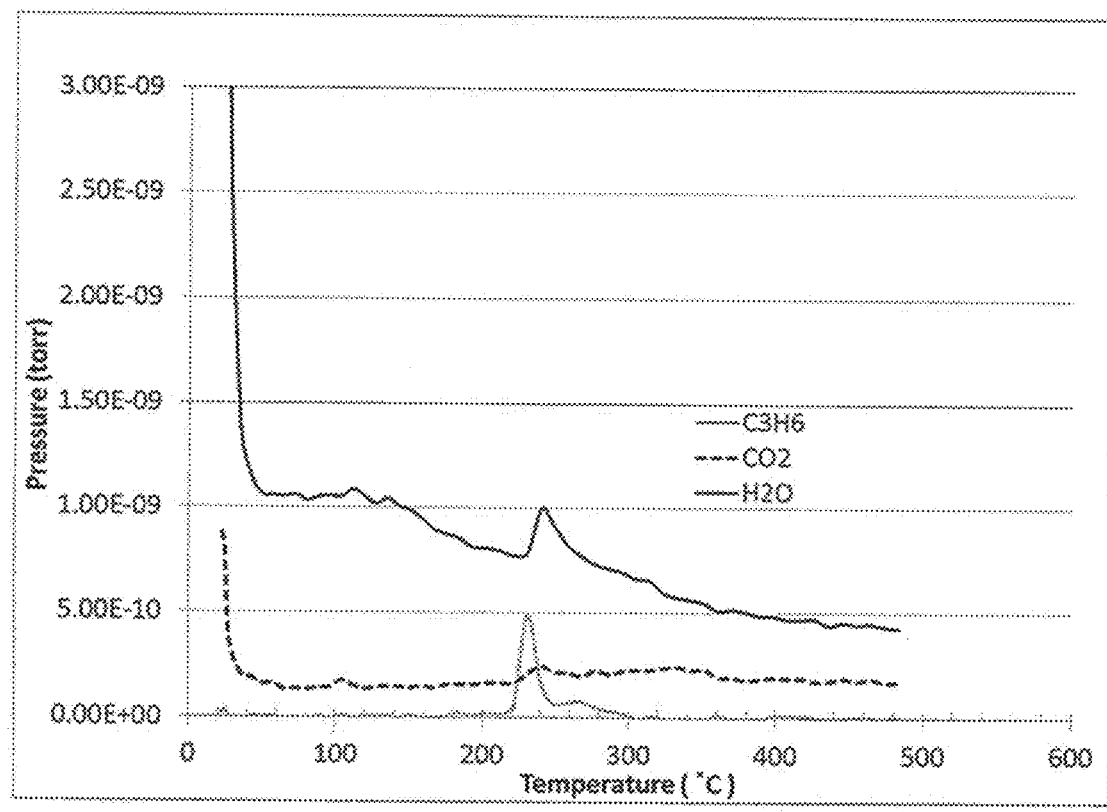
FIG. 29 is a mass spectral analysis performed in conjunction with the thermogravimetric analysis of FIG. 28.

Example 10—Preparation of an i-Propyltin Hydrolysate Via Hydrolysis of Iso-Propyltin Trichloride with an Aqueous Organic Base A hydrolysate of i-PrSnCl₃ was prepared by rapidly adding 6.5 g (24 mmol) of compound 4 i-PrSnCl₃ to 150 mL of 0.5-M aqueous tetramethyl ammonium hydroxide (TMAH) while stirring vigorously, immediately producing a precipitate. TMAH is free of metal cations in the formula so that it can be introduced with low metal contamination. The resulting mixture was stirred for 1 hour at room temperature and then filtered with suction through no. 1 filter paper (Whatman). The retained solids were washed three times with ~25-mL portions of DI H₂O and then then dried for 12 hours under vacuum (~5 torr) at room temperature. Elemental analysis (18.67% C, 4.22% H, 0.03% N, 0.90% Cl; Microanalysis, Inc.; Wilmington, Del.) of the dried powder hydrolysate, was consistent with substantial removal of chloride ions upon hydrolysis and rinsing, and again in agreement with the general stoichiometry i-PrSnSnO$_{(3/2-x/2)}$(OH)$_x$ where x≈1. (Calculated for C₃H₈O₂Sn: 18.50% C, 4.14% H, 0.00% N, 0.00% Cl). TGA-MS analyses, (dry air) of hydrolysate powders prepared by the same procedure (FIGS. 28 and 29), are likewise consistent with the same. Weight losses attributed to stepwise dehydration (50-175° C., ~97.0% residual weight) and dealkylkation/combustion (200-500° C., ~77.5% residual weight) are observed as expected on the basis of complete decomposition of to SnO₂. While this experiment was not conducted to specifically test for low metal contamination, the experiment is designed to indicate the capability for the product t-amyltin oxide hydroxide to be synthesized with low metal contamination as demonstrated in companion examples herein.

Example 11—Preparation of an Alklytin Hydroxide Oxide Hydrolysate Via Aqueous Hydrolysis of an Alkyltin Tris(Alkynide)

A t-amyl tin hydroxide oxide hydrolysate, t-AmylSnO$_{(3/2-x/2)}$ (0<x<3) (compound 6), was prepared via aqueous hydroloysis of (1,1-dimethylpropyl) tin tris(phenylacetylide), t-AmylSn(C≡CPh)₃ (compound 7)

Figure 30:
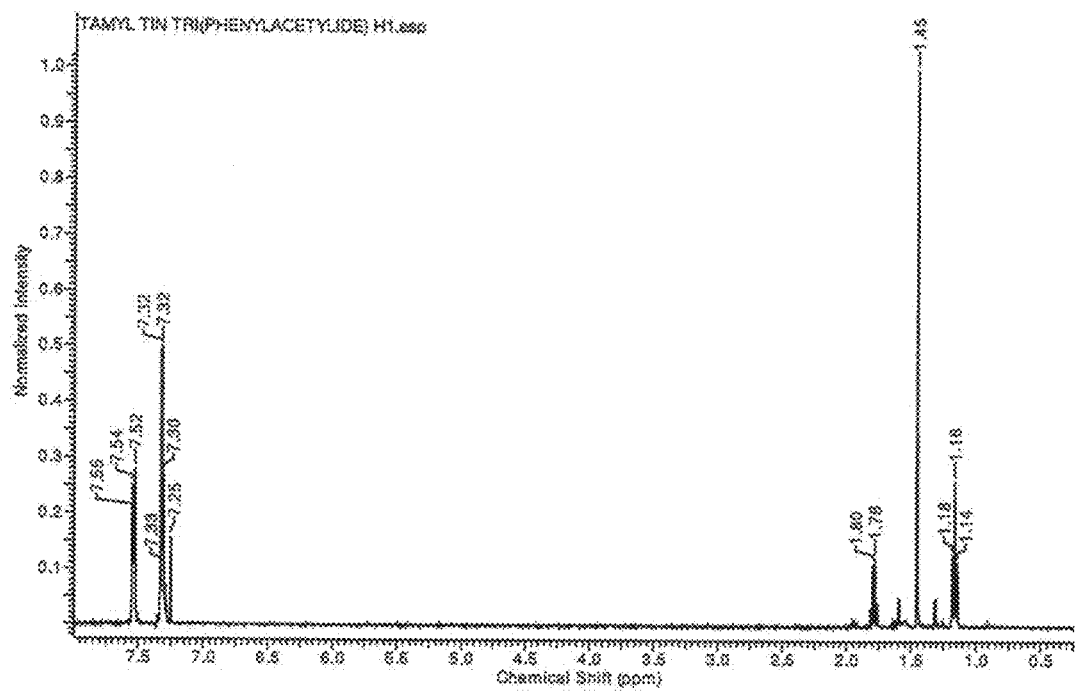
FIG. 30 is a $^1$H NMR spectrum of t-AmylSn(C≡CPh)$_3$ synthesized by the method of Example 11.
Figure 31:
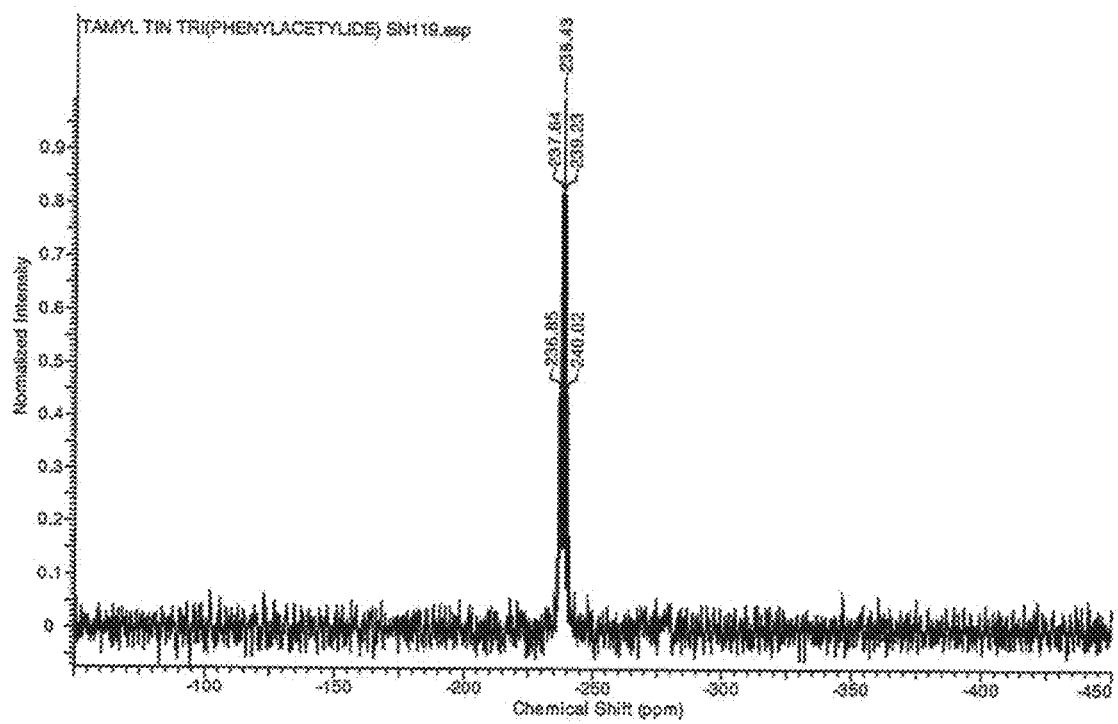
FIG. 31 is a $^{119}$Sn NMR spectrum of t-AmylSn(C≡CPh)$_3$ synthesized by the method of Example 11.
Figure 32:
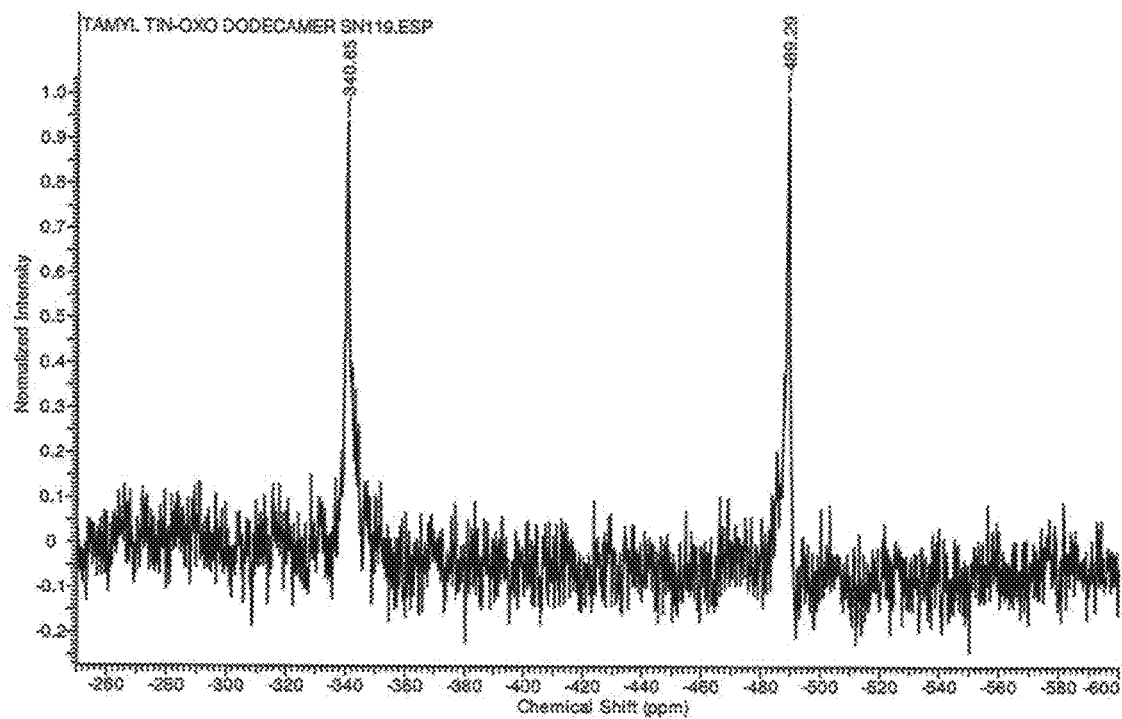
FIG. 32 is a $^{119}$Sn NMR spectrum of t-amyl tin oxide hydroxide synthesized as described in Example 11.
Figure 33:
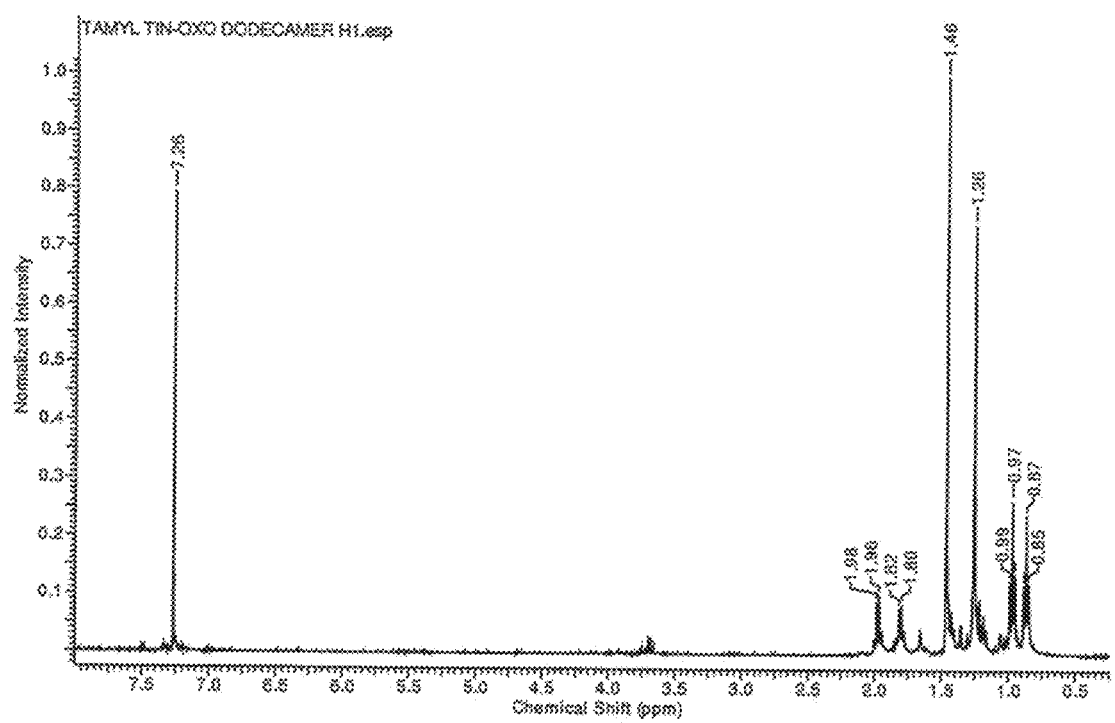
FIG. 33 is a $^1$H NMR spectrum of t-amyl tin oxide hydroxide synthesized as described in Example 11.

Tin tetra(phenylacetylide), Sn(C≡CPh)₄, compound 8 was synthesized as reported in Levashov, A. S.; Andreev, A. A.; Konshin, V. V. *Tetrahedron Letters*, 56, 2015, 56, 1870-1872, incorporated herein by reference. Compound 7 was then prepared via transmetalation of compound 8 by a modification of the method of Jaumier, et al. (Jaumier P.; Jousseaume, B.; Lahcini, M. *Angewandte Chemie, International Edition*, 38, 1999, 402-404, incorporated herein by reference): In a 150-mL flask, Sn(C≡CPh)₄ (9.53 g/19.33 mmol) was dissolved in anhydrous toluene (80 mL). Nitrogen was then bubbled through the solution for 10 min, and the solution cooled in an ice bath. 1,1-dimethylpropylmagnesium bromide solution in ether (30 mL/1 N) was then added dropwise. The solution was allowed to warm to room temperature and stirred for two hours. The reaction mixture was then filtered through silica and condensed under vacuum. The resulting solid was sonicated in anhydrous hexanes, filtered, and the supernatant condensed under vacuum. The resulting waxy solid was then recrystallized from 20% aqueous methanol (v/v) at −10° C. over the course of ~2 hours. Representative ¹¹⁹Sn and ¹H NMR spectra for compound t-AmylSn(C≡CPh)₃ synthesized by this method are found in FIGS. 30 and 31. FIG. 30 depicts the ¹H NMR spectrum. FIG. 31 depicts the ¹¹⁹Sn NMR spectrum.

tert-Amyltin hydroxide oxide, t-AmylSnO$_{(3/2-x/2)}$(OH)$_x$, where 0<x<3 (compound 6), was prepared via hydrolysis of ᵗAmylSn(C≡CPh)₃ with H₂O through an adaptation of the method Jaumier, et al. describe for unbranched alkyltin alkynides. *Chemical Communications,* 1998, 369-370, incorporated herein by reference. In a 50 mL flask, t-AmylSn(C≡CPh)₃ was dissolved in tetrahydrofuran (20 mL/2% water) and 0.5 mL water. The solution was stirred at room temperature for two days and the precipitate collected and dissolved in chloroform. The resulting solution was filtered through a 0.2 μm PTFE filter, and the solvent removed under vacuum. Representative ¹¹⁹Sn (FIG. 32) and ¹H NMR spectra (FIG. 33) were collected in CDCl₃. Observed ¹¹⁹Sn resonances at −340.65 and −489.29 ppm are characteristic of the respective five and six-coordinate tin atoms in closo-type dodecameric clusters of the form [(12Sn)₁₂O₁₄(OH)₆](OH)₂. ¹H resonances are likewise indicative of the presence of 1,1-dimethylpropyl ligands in the two chemical environments, and importantly only very weak phenyl resonances (7.29-7.60 ppm) are observed relative to FIGS. 32 and 33, indicating near-complete hydrolysis and removal of phenylacetylide ligands. While this experiment was not conducted to specifically test for low metal contamination, the experiment provides a synthetic approach that allows the product t-amyltin oxide hydroxide to be synthesized with low metal contamination as demonstrated in companion examples herein.

Figure 34:
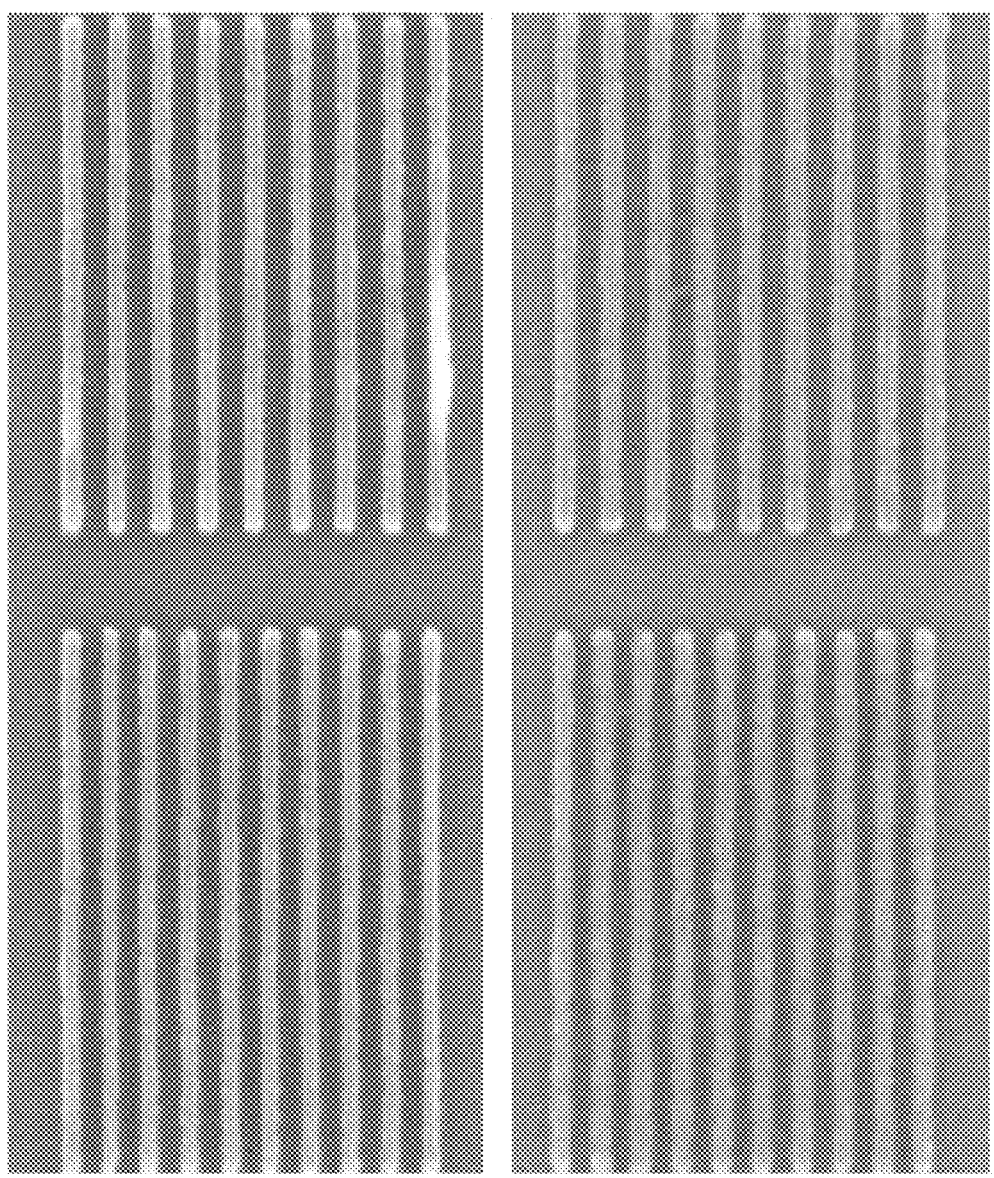
FIG. 34 is a set of SEM micrographs of silicon wafers with isopropyl tin oxide hydroxide (right images) or t-butyl tin oxide hydroxide (left images) exposed to 30-kEV electron beam and developed at a pitch of 32-nm (top) and 28-nm (bottom).

Example 12—Resist Coating, Film Processing, Negative Tone Imaging with Electron Beam Exposure t-BuSnO$_{(3/2-x/2)}$(OH)$_x$ and i-PrSnSnO$_{(3/2-x/2)}$(OH)$_x$ resist precursor solutions were prepared as described in Example 3. The solutions were spin-coated and patterned using electron-beam lithography with the process parameters summarized in Table 4. Silicon wafers (25×25 mm²) with a native-oxide surface were used as substrates for thin-film deposition. Substrates were ashed for 1 min in a 25 W O₂ plasma at 15 mTorr prior to resist coating. Precursor solutions were dispensed through a 0.45 nm syringe filter onto a substrate, spin-coated for 30 s at the indicated rpm, and baked on a hotplate for 2 min (post-apply bake, PAB) at the indicated temperature. Film thickness following coating and baking was measured via ellipsometry. The coated substrates were exposed to a 30-keV electron-beam rastered to form a line/space pattern at the designated dose. The patterned resist and substrate were then subjected to a post-exposure bake (PEB) on a hotplate for 2 min at the temperature shown in Table 4. The exposed film was then dipped in developer for 15 seconds and rinsed an additional 15 seconds with the same developer to form a negative tone image, i.e., unexposed portions of the coating were removed. A final 5-minute hotplate bake at 150° C. was performed after development. FIG. 34 exhibits an SEM image of the resulting resist line/space patterns on the substrates at a pitch of 32-nm (top) and 28-nm (bottom).

TABLE 4

| | Resist Precursor Formulation | |
| --- | --- | --- |
| | t-BuSnO$_{(3/2-x/2)}$(OH)$_x$ | i-PrSnO$_{(3/2-x/2)}$(OH)$_x$ |
| Solvent | methanol | 4-methyl-2-pentanol |
| Coating Speed (rpm) | 1500 | 2500 |
| PAB temperature (° C.) | 100 | 80 |
| Resist Film Thickness (nm) | 40 | 31 |
| PEB Temperature (° C.) | 170 | 120 |
| Developer | 2-heptanone | 2-octanone |
| Imaging Dose (μC cm$^{-2}$) | 1022 | 696 |
| 32/28 nm Pitch Resist Line Critical Dimension (nm) | 15.2/13.5 | 16.2/15.1 |

Example 13—Positive Tone Imaging with EUV Exposure

A branched-alkyltin oxide hydroxide resist was used to generate positive tone images using EUV radiation. An i-PrSnO$_{(3/2-x/2)}$(OH)$_x$ hydrolysate (compound 3) was prepared using Method 1 described in Example 7, and dissolved in 4-methyl-2-pentanol to produce ~0.07M Sn precursor solution. Silicon wafers (100 mm⁻ diameter) with a native-oxide surface were used as substrates for thin-film deposition. A hexamethyldisilazane (HMDS) vapor prime was performed on the wafers prior to coating. The precursor solutions were dispensed via pipet onto the substrate, spin-coated for 30 s at 1500 rpm, and baked on a hotplate for 2 min at 100° C. Film thickness following coating and baking was measured via ellipsometry to be ~23 nm. EUV exposures were carried out on the Berkeley MET. A series of line and space patterns at varying pitches were projected onto the wafer using 13.5-nm wavelength radiation and annular illumination at a numerical aperture of 0.3 and imaging dose of 25 mJ cm$^{-2}$. Immediately following exposure, the resist and substrate were baked a hotplate for 2 min at 150° C. in air.

Figure 35:
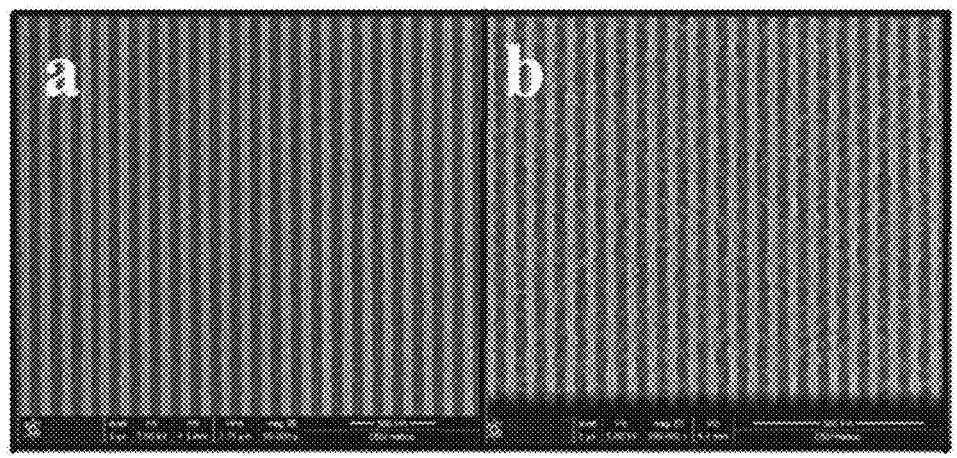
FIG. 35 is a set of two SEM micrographs of a silicon wafer patterned with isopropyl tin oxide hydroxide following exposure to EUV radiation and development for positive tone imaging with 100-nm (a) pitch and 60-nm (b) pitch.

The exposed film was dipped in a 0.52 M solution of aqueous NaOH for 15 seconds and rinsed 15 seconds with H$_2$O to develop a positive tone image, i.e., exposed portions of the coating were removed. A final 5-minute hotplate bake at 150° C. was performed after development. SEM images of positive-tone resist lines patterned on a 100-nm, (a) and 60-nm (b) pitch are found in FIG. 35.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A solution comprising a solvent and a compound represented by the formula RSnO$_{(3/2-x/2)}$(OH)$_x$ where (0<x<3), where R is an alkyl, cycloalkyl, or substituted alkyl moiety having from 1 to 31 carbon atoms, the solution having individual concentrations of contaminant metals of no more than about 1 ppm by weight wherein the concentration of tin in the solution is from about 0.01 M to about 1.5 M.

2. The solution of claim 1 wherein the concentration of tin in the solution is from about 0.02 M to about 1.5 M.

3. The solution of claim 1 wherein R is an alkyl group or cycloalkyl group with 3-31 carbon atoms, where the alkyl or cycloalkyl group is bonded to the tin at a secondary or tertiary carbon atom.

4. The solution of claim 1 wherein the compound comprises tert-butyl tin oxide hydroxide (R=—C(CH$_3$)$_3$), isopropyl tin oxide hydroxide (R=—CH(CH$_3$)$_2$), tert-amyl tin oxide hydroxide (R=—C(CH$_3$)$_2$CH$_2$CH$_3$), or mixtures thereof.

5. The solution of claim 1 further comprising a second compound distinct from the first compound and represented by the formula R'SnO$_{(3/2-x/2)}$(OH)$_x$ where (0<x<3) and R' is a linear or branched alkyl or cycloalkyl.

6. The solution of claim 1 having concentrations of individual contaminant metals of no more than about 500 ppb by weight, wherein contaminant metals have a total concentration of less than 100 ppm by weight.

7. The solution of claim 1 having concentrations of individual alkali and alkaline earth metals no more than about 100 ppb by weight.

8. The solution of claim 1 wherein the solvent is an organic solvent.

9. The solution of claim 1 further comprising a third compound distinct from the first compound and the second compound and represented by the formula R"SnO(3/2-x/2)(OH)x where (0<x<3), where R" is a linear or branched alkyl or cycloalkyl group wherein the third compound represents at least about 10 weight percent of the organometallic compounds in the coating solution.

10. The solution of claim 1 wherein the solvent comprises an alcohol.

11. The solution of claim 1 wherein the solvent comprises an organic solvent, wherein R is an alkyl or cycloalkyl group with 3-31 carbon atoms, wherein the alkyl group or cycloalkyl group is bonded to the tin at a secondary or tertiary carbon atom, and wherein the concentration of tin in the solution is from about 0.01 M to about 1.0 M.

12. A method for synthesizing a compound represented by the formula RSnOOH or RSnO$_{(3/2-x/2)}$(OH)$_x$ (0<x<3), where R is an alkyl or cycloalkyl moiety having from 1 to 31 carbon atoms, the method comprising:
hydrolyzing a precursor composition having the formula RSnX$_3$, where X represents a halide atom (F, Cl, Br or I), or amido group(s), or combinations thereof wherein the hydrolysis is performed with sufficient water to effectuate the hydrolysis, wherein the hydrolyzed composition can be placed into a solution at a concentration of 0.042M, wherein the solution has individual concentrations of metals other than tin of no more than about 1 ppm by weight.

13. The method of claim 12 wherein the hydrolysis is performed with a quaternary ammonium hydroxide.

14. The method of claim 12 wherein the hydrolysis is performed in an organic solvent with sufficient water to effectuate the hydrolysis in a controlled reaction.

15. The method of claim 14 wherein the water is added to the organic solvent in a measured quantity.

16. The method of claim 14 wherein the water is absorbed from the ambient.

17. The method of claim 12 wherein the R moiety is isopropyl, tert-butyl, tert-amyl, or a combination thereof.

18. The method of claim 12 wherein the precursor composition further comprises a precursor composition having the formula R$_1$SnX$_3$ where R$_1$ is different from R and R$_1$ is an alkyl or cycloalkyl moiety having from 1 to 31 carbon atoms.

19. The method of claim 12 wherein the alkyl or cycloalkyl group is bonded to the tin at a secondary or tertiary carbon atom.

20. The method of claim 12 wherein R is a linear or branched alkyl, substituted alkyl, and/or cycloalkyl moiety.

* * * * *